(12) United States Patent
Lin et al.

(10) Patent No.: US 11,725,885 B2
(45) Date of Patent: Aug. 15, 2023

(54) HEAT EXCHANGER FIN AND MANUFACTURING METHOD OF THE SAME

(71) Applicant: COOLER MASTER CO., LTD., Taipei (TW)

(72) Inventors: Chia Yu Lin, Taipei (TW); Shan-Yin Cheng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 17/942,639

(22) Filed: Sep. 12, 2022

(65) Prior Publication Data

US 2023/0003459 A1 Jan. 5, 2023

Related U.S. Application Data

(62) Division of application No. 17/147,182, filed on Jan. 12, 2021, now Pat. No. 11,530,879.

(Continued)

(30) Foreign Application Priority Data

Jan. 13, 2020 (TW) .................. 109101118

(51) Int. Cl.
*F28D 20/00* (2006.01)
*B21D 53/02* (2006.01)
(Continued)

(52) U.S. Cl.
CPC ........... *F28D 20/00* (2013.01); *B21D 53/022* (2013.01); *B21D 53/04* (2013.01); *B21D 53/045* (2013.01); *F28F 3/14* (2013.01); *F28F 2215/00* (2013.01); *F28F 2215/06* (2013.01); *F28F 2230/00* (2013.01); *F28F 2245/00* (2013.01); *F28F 2250/00* (2013.01); *F28F 2250/102* (2013.01); *Y10T 29/49353* (2015.01); *Y10T 29/49366* (2015.01)

(58) Field of Classification Search
CPC ......... F28D 20/00; F28F 3/14; F28F 2215/00; F28F 2215/06; F28F 2230/00; F28F 2245/00; Y10T 29/49353; Y10T 29/49366
USPC ...................................... 165/104.22
See application file for complete search history.

(56) References Cited

U.S. PATENT DOCUMENTS 2,143,171 A * 1/1939 Anderson ............. F25B 39/024
D15/89
4,931,905 A * 6/1990 Cirrito .................. F28D 15/043
361/689

(Continued)

*Primary Examiner* — Jon T. Schermerhorn, Jr.
(74) *Attorney, Agent, or Firm* — McDermott Will & Emery LLP

(57) ABSTRACT

A heat dissipation device includes a base plate and a plurality of fins arranged on the base plate. Each fin includes a fin body including a first metal sheet and a second metal sheet coupled to each other, wherein the fin body is curved and includes a first portion and a second portion transverse to the first portion, an evaporation channel defined in the first portion, one or more connecting channels disposed in the first portion and in fluid communication with the evaporation channel, a condensation channel defined in the second portion, and one or more auxiliary channels disposed in the second portion and in fluid communication with the one or more connecting channels and the condensation channel.

12 Claims, 19 Drawing Sheets

Related U.S. Application Data

(60) Provisional application No. 63/046,721, filed on Jul. 1, 2020, provisional application No. 62/970,731, filed on Feb. 6, 2020, provisional application No. 62/967,064, filed on Jan. 29, 2020.

(51) Int. Cl.
*B21D 53/04* (2006.01)
*F28F 3/14* (2006.01)

(56) References Cited

U.S. PATENT DOCUMENTS

| | | | | |
|---|---|---|---|---|
| 8,919,426 | B2* | 12/2014 | Hardesty | F28D 15/0233 165/104.21 |
| 11,181,306 | B2* | 11/2021 | Zhang | B21D 22/00 |
| 11,371,784 | B2* | 6/2022 | Kao | F28D 15/043 |
| 2010/0149755 | A1* | 6/2010 | Tomioka | F28D 15/043 165/104.26 |
| 2013/0340978 | A1* | 12/2013 | Agostini | H05K 7/20318 165/104.21 |
| 2016/0016246 | A1* | 1/2016 | Bugby | F28D 1/0477 228/101 |
| 2017/0158046 | A1* | 6/2017 | Vezina | B60K 11/02 |
| 2018/0308780 | A1* | 10/2018 | Tong | H01L 23/3733 |
| 2019/0212039 | A1 | 7/2019 | Zhang et al. | |
| 2020/0191492 | A1* | 6/2020 | Liu | F28F 3/14 |
| 2020/0232717 | A1* | 7/2020 | Kao | F28F 3/06 |
| 2022/0128316 | A1* | 4/2022 | Wen | F28D 15/0275 |
| 2022/0299277 | A1* | 9/2022 | Lin | H01L 23/367 |

\* cited by examiner

HEAT EXCHANGER FIN AND MANUFACTURING METHOD OF THE SAME

CROSS-REFERENCE TO RELATED APPLICATIONS

This application is a divisional application of and claims benefit under 35 U.S.C. § 120 of U.S. non-provisional application Ser. No. 17/147,182, filed Jan. 12, 2021, which claims priority to under 35 U.S.C. § 119 to U.S. provisional application Nos. 62/967,064, filed Jan. 29, 2020, 62/970,731, filed Feb. 6, 2020, and 63/046,721, filed Jul. 1, 2020. This divisional application also claims priority under 35 U.S.C. § 119 to Taiwanese Patent Application No. 109101118 filed Jan. 13, 2020, in the Taiwan Intellectual Property Office. The entire contents of the foregoing applications are hereby incorporated by reference.

TECHNICAL FIELD

Embodiments of the disclosure relate generally to the field of heat transfer and, more particularly, to heat exchanger fins and manufacturing methods of the same.

BACKGROUND

During operation, electronic devices generate heat that must be dissipated quickly and efficiently to keep operating temperature within manufacturer recommended ranges in a range of operating conditions. As the electronic devices become more and more complex, the power requirements thereof increases and heat generated is increased. Thus, cooling requirements increase.

Several techniques have been developed for dissipating heat from electronic devices. One such technique is an air-cooling system, wherein a heat exchanger is in thermal contact with the heat generating devices for transporting heat away from the devices, and air flowing over the heat exchanger cools the heat exchanger and thereby removes heat from the heat exchanger. One type of heat exchanger includes a plurality of fins extending from a base plate. The plurality of fins increases the rate of heat transfer via convection to the environment of the heat exchanger by increasing the surface area of a heat source in thermal contact with the heat exchanger. Heat is transferred from the heat source to the base plate, the base plate to the plurality of fins and the environment, and the plurality of fins to the environment.

The heat transfer may be aided by a fan, blower, or any other device that increases air flow over the fins, or heat can be transferred by natural heat loss due to convection. In natural convection, the heated temperature air is less dense than the surrounding air (environment) and rises from the heat exchanger and plurality of fins. For natural convection to be effective, the heat exchanger and orientation of the plurality of fins during operation are positioned in a direction that will not impede air movement. When positioned horizontally, the plurality of fins face upward, and when positioned vertically, the plurality of fins are oriented to allow higher temperature air to rise.

The thermal performance of the plurality of fins of the heat exchangers is dependent on heat transfer effectiveness. Thus, shape, thickness, material, and other structural enhancements contribute to the thermal performance of the plurality of fins. One type of enhancement is a closed-looped system, wherein a vacuum area carries heat from the heat source by evaporation of a working fluid which is spread by a vapor flow filling the vacuum. The vapor flow condenses over cooler surfaces, and, as a result, the heat is distributed from a heat source evaporation interface surface to a larger condensation cooling surface area. Flow instabilities occur inside the enhanced heat exchangers due to the heat input at the heat source end and heat output at the cooling surface end. Thereafter, condensed fluid flows back to the evaporation surface.

When a closed-looped heat exchanger is positioned vertically, the plurality of fins are aligned such that higher temperature air can rise. However, the added weight of the closed-looped enhancement requires costly attachments to couple the fins to the heat source and/or non-standard attachment mechanisms. Also, due to the vertical alignment, heat transfer efficiency of the closed-looped enhancement decreases along the mounted surface of the heat exchanger the further the mounted surface is away from ground due to the inefficiency of the working fluid to rise against gravity. Thus, the occurrence of dry-out is increased, causing the electronic devices to overheat, fail or be damaged. In some electronic device that operate vertically (e.g., longitudinal dimension is oriented vertical to the ground or base), there are more than one source of heat and thus more than one heat source areas (on the heat exchanger) which will need cooling by the heat exchanger. Operating temperature allowance for relatively lower-powered electronic devices is less than that of relatively higher-powered electronic devices. The lower-powered electronic devices may be positioned closer to ground (e.g. at a lower position) compared to the higher-powered electronic devices due to rising of higher temperature air. For certain heat exchangers, improved heat dissipation efficiency is often observed in portions of the heat exchanger that are closer to ground, since the working fluid accumulates there due to gravity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
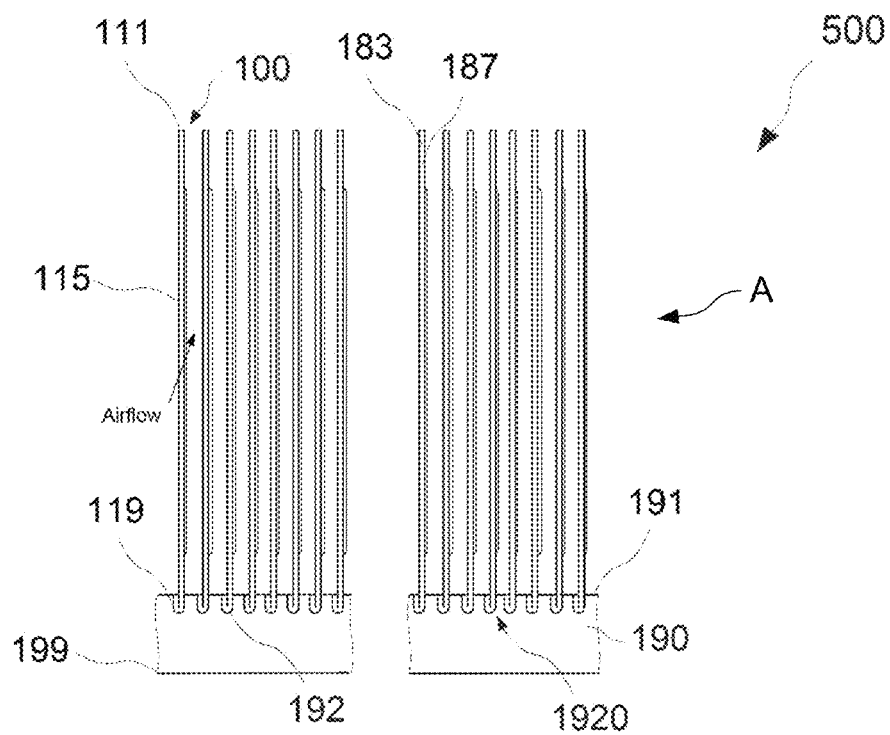
FIG. 1A is a schematic front elevation view of a heat exchanger, according to embodiments of the disclosure.

It is to be understood that the following disclosure provides many different embodiments, and examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure are directed to heat exchangers and heat exchanger fins, and having a working fluid under vacuum therein, and manufacturing methods of the heat exchanger fins. In an embodiment, a heat exchanger includes a plurality of heat exchanger fins and a base plate. Each heat exchanger fin comprises an exchanger enhancement having channels therein. The channels are formed by first and second metal sheets. The channels are under vacuum and have a working fluid therein. The channels decrease the volume of working fluid and facilitates the creation of non-equilibrium pressure conditions, strengthening self-sustaining turbulent driving forces within each heat exchanger fin for heat dissipation. The channels (or a portion thereof) of the heat exchangers, according to embodiment of the disclosure, provide improved efficiency in dissipating heat from both low-power, low operating temperature heat sources and from high-power, high operating temperature heat sources. The low-power, low operating temperature heat sources and the high-power, high operating temperature heat sources are positioned vertically separated from each other, wherein the low-power, low operating temperature heat sources are placed at a lower level (below) the high-power, high operating temperature heat sources on an heat exchanger.

Figure 1B:
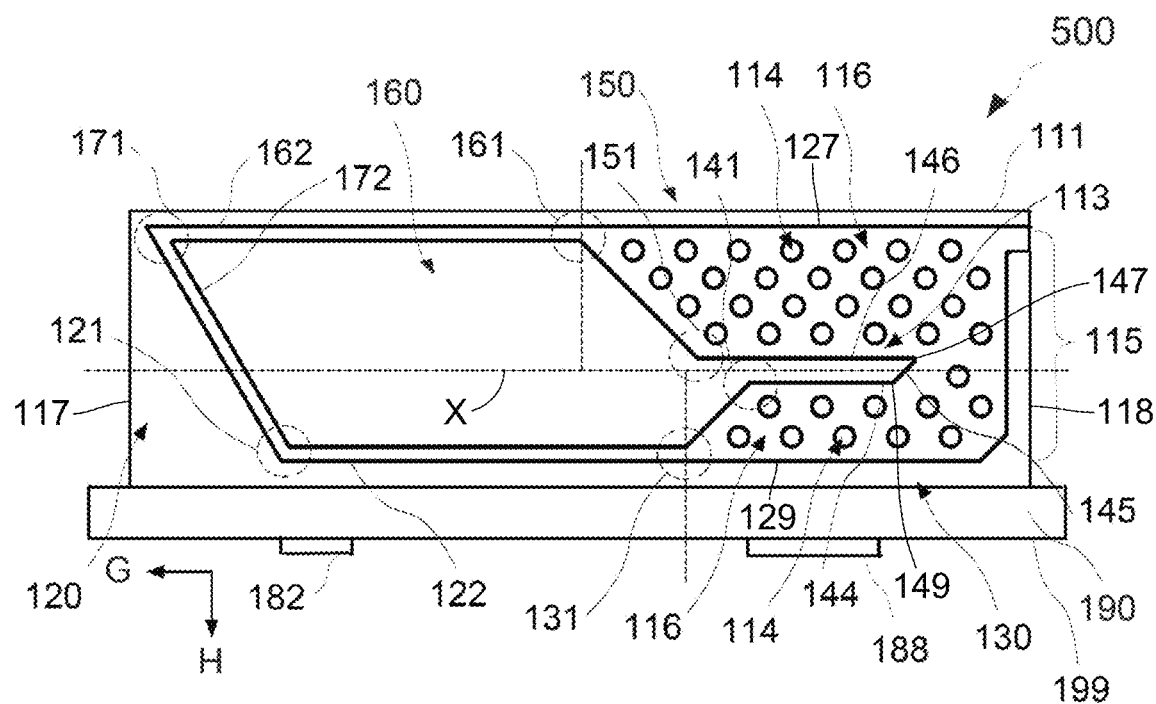
FIG. 1B is a schematic diagram of a right side view of a fin of the heat exchanger in FIG. 1A, according to embodiments of the disclosure.

FIG. 1A is a schematic front elevation view of a heat exchanger 500, according to embodiments of the disclosures. FIG. 1B is a schematic diagram of a right side view of a fin 100 of the heat exchanger 500, according to embodiments of the disclosure. The heat exchanger 500 is used to cool one or electronic devices. Referring to FIGS. 1A and 1B, the heat exchanger 500 includes a plurality of heat exchanger fins 100 and which are thermally coupled to a base plate 190. Each heat exchanger fin 100 includes a fin base 119, a fin edge 111 opposite the fin base 119, and an exchanger enhancement section portion 115 between the fin base 119 and fin edge 111. The base plate 190 includes a top or mounting surface 191 and a bottom or contact surface 199 opposite the mounting surface 191. The mounting surface 191 has a plurality of mounting grooves 192 thereon, substantially parallel to each other and spaced apart at desired intervals.

The dimensions (e.g., length, breadth, thickness), depth, and number of mounting grooves 192 correspond to the dimensions (e.g., length, breadth, thickness), height and number of fins 100. Each fin base 119 of each heat exchanger fin 100 is thermally and mechanically coupled to each mounting groove 192 using suitable techniques such as brazing techniques, for instance. However, other techniques can also be used as long as heat may be efficiently and effectively transferred from the base plate 190 to the plurality of heat exchanger fins 100. In some embodiments, each fin base 119 is hemmed, thereby reinforcing the strength thereof and increasing the surface area for conductive heat transfer from the base plate 190 to the plurality of heat exchanger fins 100. As illustrated, the hemmed portion of each fin 100 is inserted into the base plate 190 for securely mounting each 100 to the base plate 190.

The area occupied by the plurality of heat exchanger fins 100 on the mounting surface 191 may be varied depending upon the spacing between the individual fins 100 and as required by application and design. As an example, the fins 100 occupy a smaller area when the fins 100 are closely positioned. This results in an empty, non-occupied portion of the mounting surface 191 that does not include fins 100.

One or more electronic devices generating heat (heat sources) are attached to the contact surface 199, for example by fasteners (e.g., nuts, screws, bolts, pins, clips etc.) or by other means such as thermal paste as long as heat from the electronic device is efficiently and effectively transferred from the one or more electronic source to the base plate 190. In some embodiments, multiple heat sources, for example, a first heat source 182 and a second heat source 188 are attached to the contact surface 199 of the base plate 190. For the purposes of discussion herein, it is assumed that the power requirement and maximum operating temperature allowance of the first heat source 182 is less than that of the second heat source 188 and when in operation, the first heat source 182 is positioned lower (e.g., closer to ground (G)) than the second heat source 188 on the fin 100.

Figure 2A:
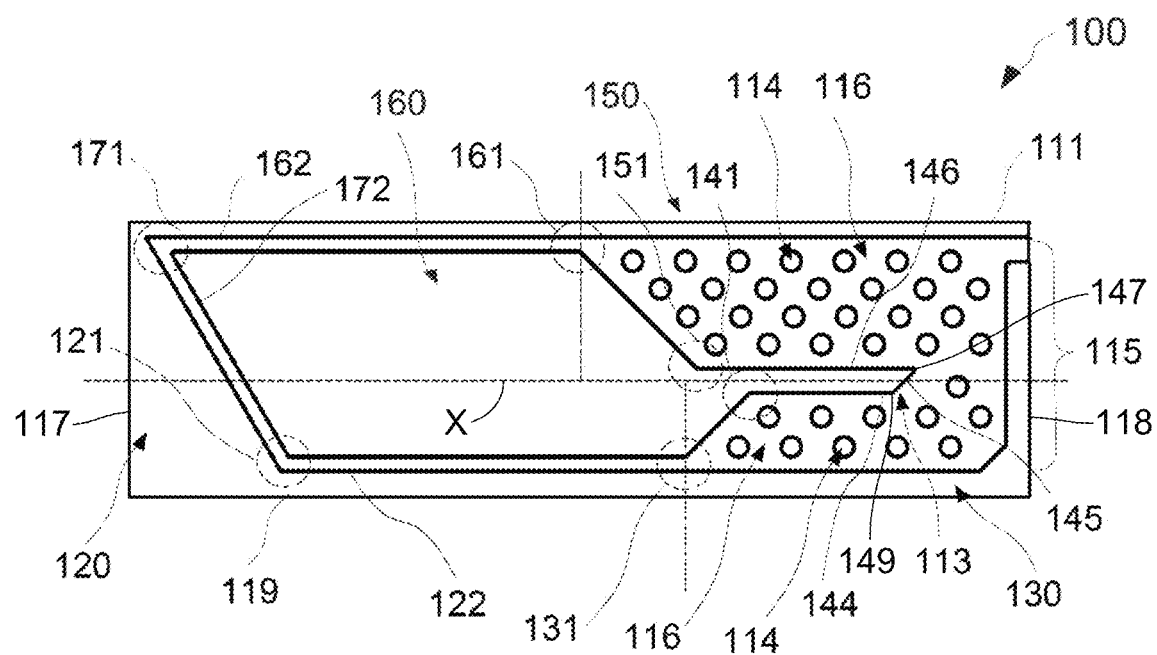
FIG. 2A is a schematic diagram of a right side view of the fin of the heat exchanger of FIGS. 1A and FIG. 1B without the base plate, according to embodiments of the disclosure.
Figure 2B:
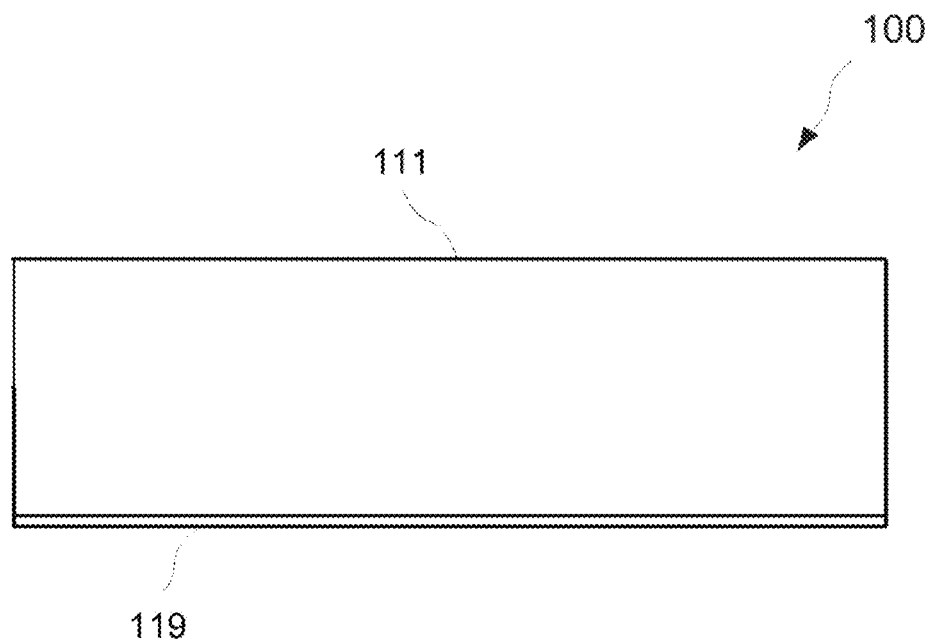
FIG. 2B is schematic diagram of a left side view of the heat exchanger fin in FIG. 2A, according to embodiments of the disclosure.

FIG. 2A is a schematic diagram of a right side view of a fin 100 of the heat exchanger 500 of FIG. 1A and FIG. 1B without the base plate 190, according to embodiments of the disclosure. FIG. 2B is schematic diagram of a left side view of the heat exchanger fin in FIG. 1A, according to embodiments of the disclosure. Referring to FIGS. 2A and 2B, and with continued reference to FIGS. 1A and 1B, each heat exchanger fin 100 includes a first evaporator region 120, a second evaporator region 130, a first condenser region 160, and a second condenser region 150, a lower edge 117, and an upper edge 118 longitudinally opposite the lower edge 117.

It should be understood that the first evaporator region 120, the second evaporator region 130, the first condenser region 160, and the second condenser region 150 are regions of the fin 100 generally indicated for the sake of explanation. The first evaporator region 120 is located in the lower left side of the fin 100 and is at least partially defined by the lower edge 117 of the fin 100 and the fin base 119. The second evaporator region 130 is located in the lower right side of the fin 100 and is at least partially defined by the upper edge 118 of the fin 100 and the fin base 119. The first condenser region 160 is located in the upper left side of the fin 100 and above the first evaporator region 120 and is at least partially defined by the lower edge 117 of the fin 100 and the fin edge 111. The second condenser region 150 is located in the upper right side of the fin 100 and above the second evaporator region 130 and is at least partially defined by the upper edge 118 of the fin 100 and the fin edge 111. The first and second evaporator regions 120, 130 and first and second condenser regions 160, 150 form the exchanger enhancement portion 115 of each fin 100.

The second evaporator region 130 and the second condenser region 150 include a plurality of obstructers 114 arranged in a matrix-type formation and having a desired separation between each other. As discussed elsewhere in this document, the plurality of obstructers 114 are formed by bonding first and second metal sheets 183 and 187 (e.g., the inner surfaces of thereof) of each fin 100 at one or more discrete locations, while the inner surfaces of the metal sheets 183 and 187 in the portions around each obstructer 114 are not bonded to each other. The portions that are not bonded define a network of channels 116 (also referred to as braided channels) that extends between the obstructers 114. The plurality of obstructers 114 thus define a plurality of recessed portions formed in the outer surface of the second metal sheet 187. In some embodiments, the number of the obstructers 114 (and thereby the number of channels 116) of the second condenser region 150 is at least equal to or greater than the number of obstructers 114 (and thereby the number of channels 116) of the second evaporator region 130.

The second evaporator region 130 and the second condenser region 150 further include at least a portion of a dividing obstructer 113. The dividing obstructer 113 includes an evaporation side 144, a condensation side 146, and a flow side 145 connected to ends of the evaporation side 144 and condensation side 146 adjacent the upper edge 118. The evaporation side 144, the condensation side 146, and the flow side 145 are defined by edges (or boundaries) created in the metal sheet 187 by selectively bonding the inner surfaces of the metal sheets 183 and 187. The evaporation and condensation sides 144, 146 are generally parallel to each other and separated from each other.

The evaporation side 144 extends between an evaporation side end 141 and the flow side 145. The condensation side 146 extends between a condensation side end 151 and the flow side 145. As illustrated, the flow side 145 is angled with respect to the condensation side 146 and the evaporation side 144. The flow side 145 includes a top end 147 where the flow side 145 and the condensation side 146 connect and a bottom end 149 opposite the top end 147 where the flow side 145 and the evaporation side 144 connect. The top end 147 is closer to the upper edge 118 than the bottom end 149. This structure improves vapor flow from the second evaporator region 130 to the second condenser region 150 and further increases output pressure gain in downward working fluid flow of a condensation channel 162.

As illustrated, the dividing obstructer 113 defines a longitudinal axis X of the fin 100 and straddles portions of the second evaporator region 130 and the second condenser region 150 about the axis X. The axis X is generally parallel to the fin base 119, and vertically separates the first condenser region 160 and second condenser region 150 from the first evaporator region 120 and second evaporator region 130. The axis X generally defines the inner perimeters of the first evaporator region 120, the second evaporator region 130, first condenser region 160, and second condenser region 150.

The plurality of obstructers 114 are generally circular-shaped having a staggered pitch. However, embodiments are not limited thereto and the plurality of obstructers 114 can have other shapes, such as polygonal shapes, and/or non-staggered pitches, depending upon application and design requirements.

The first condenser region 160 includes a condensation channel 162 and the first evaporator region 120 includes an evaporation channel 122. Each of the condensation channel 162 and evaporation channel 122 are formed by selectively bonding portions of the inner surfaces of the metal sheets 183 and 187 that form the fin 100. The evaporator channel 122 transports vapor generated due to heating of the working fluid flowing in the fin and the condensation channel 162 transports the condensed vapor.

The condensation channel 162 is in fluid communication with the plurality of obstructers 114 and channels 116 of the second condenser region 150 and the evaporation channel 122 is in fluid communication with the plurality of obstructers 114 and channels 116 of the second evaporator region 130. The first condenser region 160 and the first evaporator region 120 each further include at least a portion of a connecting channel 172 that is in fluid communication with the condensation channel 162 and the evaporation channel 122. A condensation channel end 171 of the condensation channel 162 is defined by the connection between the condensation channel 162 and the connecting channel 172 and an evaporation channel end 121 of the evaporation channel 122 is defined by the connection between the evaporation channel 122 and the connecting channel 172. The condensation channel 162, the evaporation channel 122, and the connecting channel 172 are formed as raised structures on the outer surface of the second metal sheet 187, as opposed to the plurality of obstructers 114 that are formed as recesses.

The condensation channel 162 and the evaporator channel 122 are parallel to each other and the connecting channel 172 is inclined (greater than 0° and less than 90°) with respect to the condensation channel 162 and the evaporation channel 122. The evaporation channel end 121 is closer to the edge 117 than the condensation channel end 171. This angled position of the connecting channel 172 causes the working fluid from the downward working fluid flow to be driven upward into the second evaporator region 130 from the evaporation channel 122.

A condensation channel end 161 of the condensation channel 162 is defined by the connection between the condensation channel 162 and the channels 116 of the second condenser region 150 and an evaporation channel end 131 of the evaporation channel 122 is defined by the connection between the evaporation channel 122 and the channels 116 of the second evaporator region 130. The condensation channel end 161 defines a condenser partition between the first and second condenser regions 150, 160 perpendicular to the axis X, and the evaporation channel end 131 defines an evaporator partition between the first and second evaporator regions 120, 130, perpendicular to the axis X.

The first evaporator region 120 is therefore defined by the fin base 119, the axis X, the lower edge 117, and the evaporator partition between the first and second evaporator regions 120, 130. The first condenser region 160 is defined by the axis X, the lower edge 117, fin edge 111, and the condenser partition between the first and second condenser regions 150, 160. The second evaporator region 130 is defined by the axis X, the evaporator partition between the first and second evaporator regions 120, 130, the fin base 119, and the upper edge 118. The second condenser region 150 is defined by the axis X, the fin edge 111, the condenser partition between the first and second condenser regions 150, 160, and the upper edge 118.

In some other embodiments, the fin 100 includes more than one condensation channel 162, more than one evaporation channel 122, and more than one connecting channel 172, without departing from the scope of the disclosure. As an example, embodiments include two condensation channels communicating with one connecting channel or two connecting channels communicating with one condensation channel and one evaporation channel.

In some embodiments, the flow volume of the condensation channel 162, the evaporation channel 122, and the connecting channel 172 is even throughout the channels. However, embodiments are not limited in this regard and the volume can be varied as required by application and design.

Each heat exchanger fin 100 is made of a first metal sheet 183 and a second metal sheet 187 that are coupled to each other at the corresponding ends to form the fin base 119 and fin edge 111. As discussed above, the inner surfaces of the metals sheets 183 and 187 are selectively bonded to form the exchanger enhancement portion 115 that includes at least one condensation channel 162, at least one connecting channel 172, at least one evaporation channel 122, a dividing obstructer 113, plurality of obstructers 114 and channels 116. The first metal sheet 183 includes a first inner surface and the second metal sheet 187 includes a second inner surface. The second inner surface at least partially defines the exchanger enhancement portion 115 that includes the at least one condensation channel 162, the at least one connecting channel 172, the at least one evaporation channel 122, the dividing obstructer 113, the plurality of obstructers 114, and channels 116.

In some embodiments, each of the plurality of heat exchanger fins 100 is under vacuum and has a working fluid therein. The working fluid is distributed in the form of liquid vapor slugs/bubbles throughout the channels 116. Each heat exchanger fin 100 includes a main evaporator region (e.g., second evaporator region 130), a main condenser region (e.g., second evaporator region 150), vapor flow channels 116 extending from the main evaporator region and the main condenser region, and working fluid condenser channels (e.g., condensation channel 162), working fluid transport channels (e.g., connecting channel 172), and working fluid evaporator channels (e.g., evaporation channel 122).

When heat from a first heat source 182 and a second heat source 188 is applied to the first and second evaporator regions 120, 130 (fin base 119), the heat converts the working fluid to vapor and the vapor bubbles increase within the second evaporator region 130. Meanwhile, at the second condenser region 150, heat is removed and the bubbles decrease. The volume expansion due to vaporization and the contraction due to condensation cause an oscillating motion within the channels (e.g., one or more of the channels 116, the condensation channel 162, the connecting channel 172, and the evaporation channel 122). The volume of the second condenser region 150 is at least equal to or greater than the volume of the second evaporator region 130, facilitating the oscillating motion. The net effect of the temperature gradient between the second evaporator region 130 and second condenser region 150 and the difference in vapor pressure in the channels 116 and working fluid channels (e.g., condensation channel 162, one connecting channel 172, and evaporation channel 122) creates a non-equilibrium pressure condition. The increased output pressure gain in downward working fluid flow to the condensation channel 162, increases upward oscillation driving forces throughout the connecting channel 172 and the evaporation channel 122, and thus improves the heat transfer efficiency rate along each fin edge 111 for electronic devices that operate vertically, thereby improving thermal performance. The evaporation channel end 121 is spaced from the ground compared to the condensation channel end 171 to facilitate the working fluid from the downward working fluid flow to be driven upward into the second evaporator region 130 from the evaporation channel 122. Thermo-fluidic transport is provided within each heat exchanger fin 100 via the self-sustaining oscillation driving forces, whereby the pressure pulsations are thermally driven.

Thus, when the amount of working fluid in the condensation channel 162, the connecting channel 172, and the evaporation channel 122, and channels 116 of the second evaporator region 130 and second condenser region 150 is around 40% to around 80% (also referred to as a filling ratio), the amount of working fluid for efficient and effective thermal performance is reduced by 40% to 60% when compared to prior art heat exchangers that do not include the condensation channel 162, the connecting channel 172, and the evaporation channel 122, and channels 116.

Weight of the plurality of heat exchanger fins 100 is reduced, eliminating the need for more costly attachment materials or non-standard attachment mechanisms. Furthermore, via the evaporation channel 122 and channels 116 of the evaporator region 130, an increased amount of working fluid is contained in the evaporator region 130 further away from ground. Thus, heat dissipation efficiency is driven upward, opposite the direction of gravity, mitigating dry-out from occurring, causing the electronic device to overheat, fail or be damaged. Even more, the lesser maximum operating temperature allowance for lower-powered electronic devices is more compatibly met via the evaporation channel 122, and the greater maximum operating temperature allowance for lower-powered electronic devices is more compatibly met via the upward driven increase in heat dissipation efficiency. When there are more than one heat source, as an example, three heat sources, a first heat source, a second heat source, and a third heat source between the first and second heat sources, heat dissipation efficiency is increased for the second heat source, closest to the upper outer perimeters of the second evaporator region 130 and second condenser region 150, when compared to existing heat exchangers. Thus, electronic devices are limited from overheating, failing or being damaged via the more compatible matching of heat dissipation efficiency and power output and maximum heat tolerance of the heat sources attached to the contact surface 199 of the base plate 190.

The shape and width of the dividing obstructer 113, and lengths of the second evaporation and condensation sides 144, 146 may be varied depending upon application and design requirements as long as the top end 147 of the dividing obstructer 113 is closer to the upper edge 118 than the bottom end 149, and the volume of the channels 116 of the second condenser region 150 is at least equal to or greater than the volume of the braided channels 116 of the second evaporator region 130.

Figure 3A:
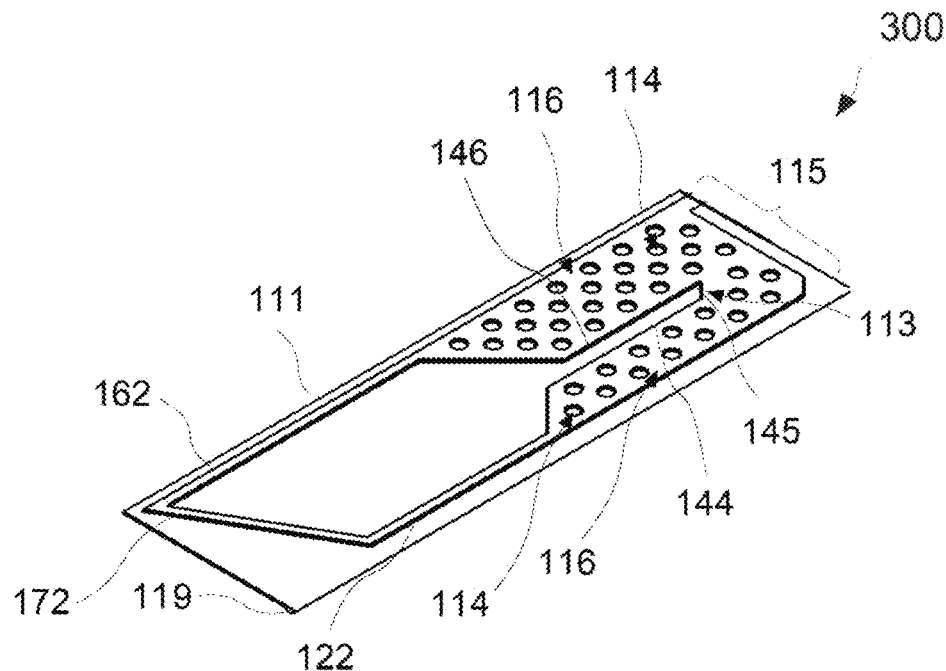
FIG. 3A is a schematic perspective view of a heat exchanger fin, according to embodiments of the disclosure.
Figure 3B:
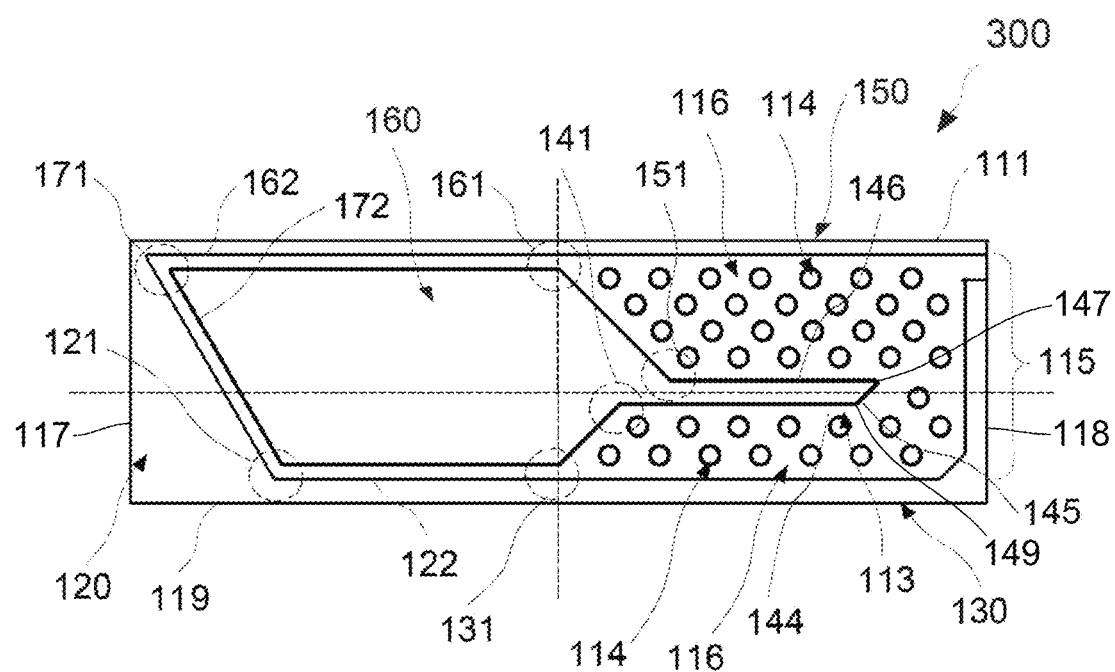
FIG. 3B is a plan view of the heat exchanger fin of FIG. 3A, according to embodiments of the disclosure.

FIG. 3A is a schematic perspective view of a heat exchanger fin 300, according to embodiments of the disclosure. FIG. 3B is a plan view of the heat exchanger fin 300 of FIG. 3A, according to embodiments of the disclosure. The heat exchanger fin 300 may be similar in some respects to the heat exchanger fin 100 in FIGS. 1A-2B, and therefore may be best understood with reference where like numerals designate like components not described again in detail. Referring to FIGS. 3A and 3B, and with continued reference to FIGS. 1A to 2B, in the heat exchanger fin 300, the length of the second evaporation side 144 of the dividing obstructer 113 is longer than the length of the second condensation side 146. Thus, for electronic devices that operate vertically, heat dissipation efficiency is higher near the ground (lower portion of the fin) because working fluid is accumulated at the lower portion of the fin and thus a heat source having an increased power output and heat tolerance can be attached to the fin 300 closer to ground. In the heat exchanger fin 300, the top end 147 of the dividing obstructer 113 is closer to the upper edge 118 than the bottom end 149, and the number of channels 116 of the second condenser region 150 is at least equal to or greater than the number of the channels 116 of the second evaporator region 130. With reference to the orientation of the heat exchanger fin 300 in FIGS. 3A and 3B, the condensation side end 151 is closer to the upper edge 118 in the longitudinal direction than the evaporation side end 141, and the condensation channel end 161 and the evaporation channel end 131 are collinear.

Figure 4A:
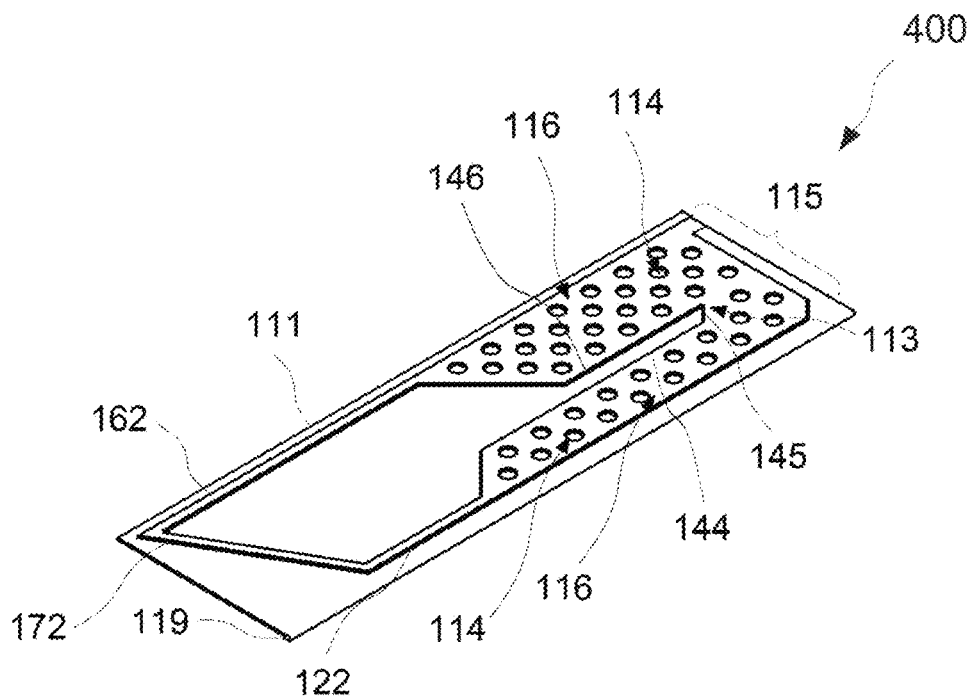
FIG. 4A is a schematic perspective view of a heat exchanger fin, according to embodiments of the disclosure.
Figure 4B:
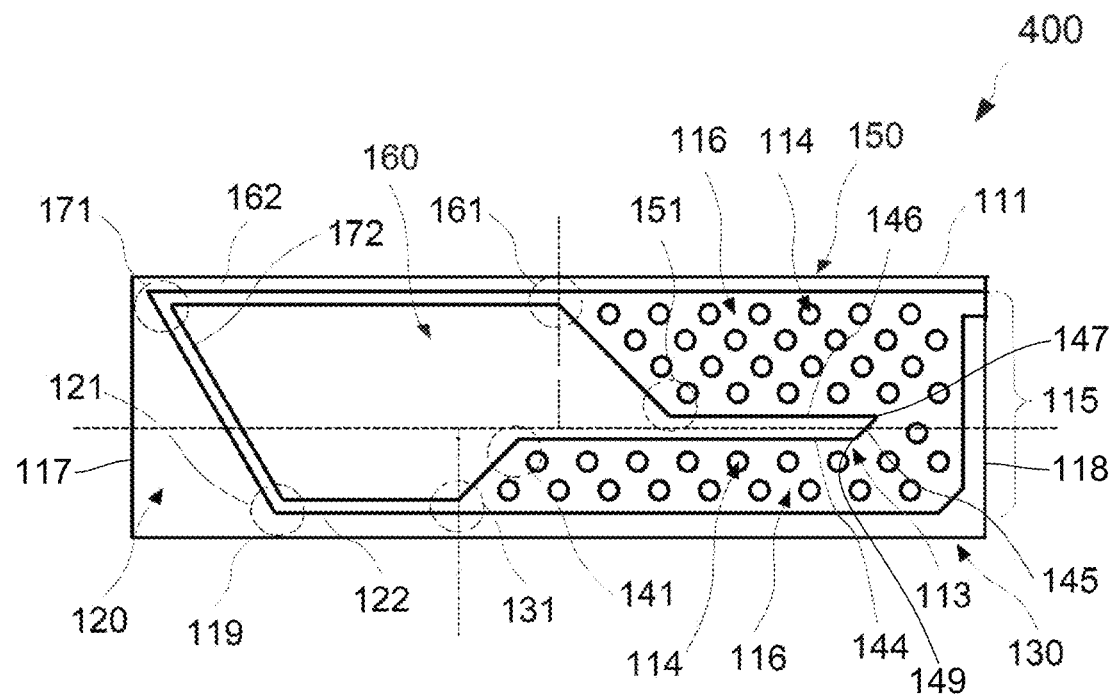
FIG. 4B is a plan view of the heat exchanger fin of FIG. 4A, according to embodiments of the disclosure.

FIG. 4A is a schematic perspective view of a heat exchanger fin 400, according to embodiments of the disclosure. FIG. 4B is a plan view of the heat exchanger fin 400 of FIG. 4A, according to embodiments of the disclosure. The heat exchanger fin 400 may be similar in some respects to the heat exchanger fins 100 and 300 in FIGS. 1A-3B, and therefore may be best understood with reference thereto where like numerals designate like components not described again in detail. Referring to FIGS. 4A and 4B, and with continued reference to FIGS. 1A to 3B, in heat exchanger fin 400, the length of the second evaporation side 144 of the dividing obstructer 113 is longer than the length of the second evaporation side 144 in FIG. 3A, and is longer than the length of the second condensation side 146. Thus, for electronic devices, greater heat dissipation efficiency is obtained even closer to ground (lower portion of the fin) and thus a heat source having an increased power output and heat tolerance can be attached to the fin 400 even more closer to ground. In the heat exchanger fin 400, the top end 147 of the dividing obstructer 113 is closer to the upper edge 118 than the bottom end 149 and the number of the channels 116 in the condenser region 150 is at least equal to or greater than the number of the channels 416 in the evaporator region 130. With reference to the orientation of the heat exchanger fin 400 in FIGS. 4A and 4B, the condensation side end 151 is closer to the upper edge 118 in the longitudinal direction than the evaporation side end 141, and the evaporation channel end 131 is closer to the lower edge 117 than the condensation channel end 161.

Figure 5A:
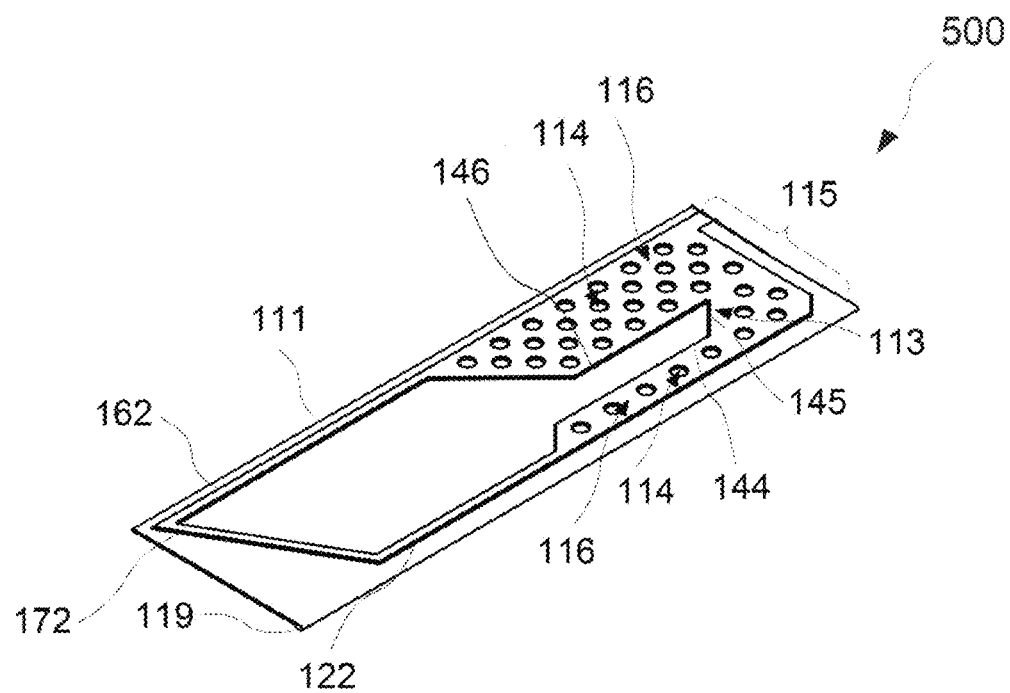
FIG. 5A is a perspective view of a heat exchanger fin, according to embodiments of the disclosure.
Figure 5B:
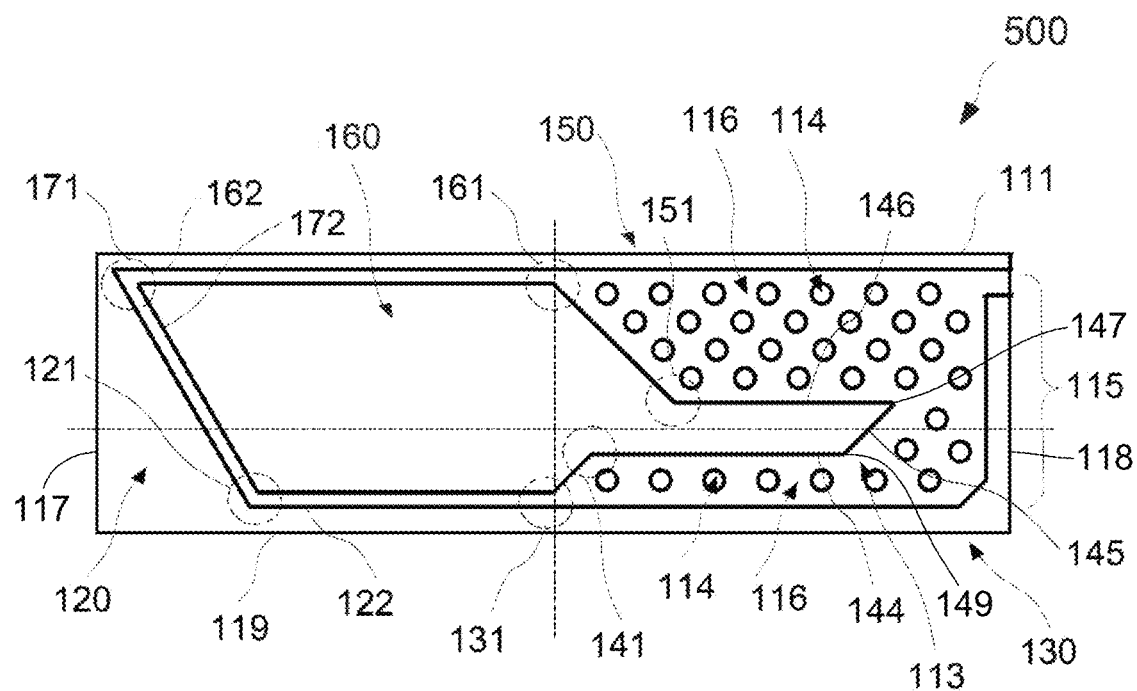
FIG. 5B is a plan view of the heat exchanger fin of FIG. 5A, according to embodiments of the disclosure.

FIG. 5A is a perspective view of a heat exchanger fin 500, according to embodiments of the disclosure. FIG. 5B is a plan view of the heat exchanger fin 500 of FIG. 5A, according to embodiments of the disclosure. The heat exchanger fin 500 may be similar in some respects to the heat exchanger fins 100, 300, and 400 in FIGS. 1A-4B, and therefore may be best understood with reference thereto where like numerals designate like components not described again in detail. Referring to FIGS. 5A and 5B, and with continued reference to FIGS. 1A to 4B, in the heat exchanger fin 500, the length of the second evaporation side 144 of the dividing obstructer 113 is longer than the length of the second condensation side 146, similar to the lengths in FIGS. 3A and 3B, and the width of the dividing obstructer 113 is wider than the width in the fins 100, 300, and 400. The widening of the dividing obstructer 113 decreases the number of obstructers 114 and the channels 116 of the second evaporator region 130. Thus, for electronic devices, greater heat dissipation efficiency is obtained closer to ground (lower portion of the fin) and thus a heat source having an increased power output and heat tolerance can be attached to the fin 500 closer to ground. Due to the increase in width of the dividing obstructer 113, working fluid volume in the fin is decreased and weight of the heat exchanger fin 500 is decreased. In the heat exchanger fin 500, the top end 147 of the dividing obstructer 113 is closer to the upper edge 118 than the bottom end 149. With reference to the orientation of the heat exchanger fin 500 in FIGS. 5A and 5B, the condensation side end 151 is closer to the upper edge 118 in the longitudinal direction than the evaporation side end 141, and the evaporation channel end 131 and the condensation channel end 161 are collinear. The number of the channels 116 of the second condenser region 150 is at least equal to or greater than the number of the channels 516 of the second evaporator region 530.

The plurality of heat exchanger fins 100, according to embodiments of the disclosure, having a working fluid under vacuum in the channels 116, compatibly matches heat dissipation and thermal performance with heat dissipation requirements and thermal performance requirements of more than one heat source attached to the contact surface 199 of the base plate 190. The condensation channel 162, the connecting channel 172, the evaporation channel 122, the channels 116 formed by the plurality of obstructers 114, and the dividing obstructer 113, increase the creation of non-equilibrium pressure conditions and increase the self-sustaining turbulent driving forces within the condensation channel 162, the connecting channel 172, and the evaporation channel 122, and the channels 116.

In some embodiments, the first and second inner surfaces of the first and second metal sheets 183, 187 are bonded together and integrally formed at areas other than the condensation channel 162, the connecting channel 172, the evaporation channel 122, and the dividing obstructer 113, and the channels 116.

Figure 6:
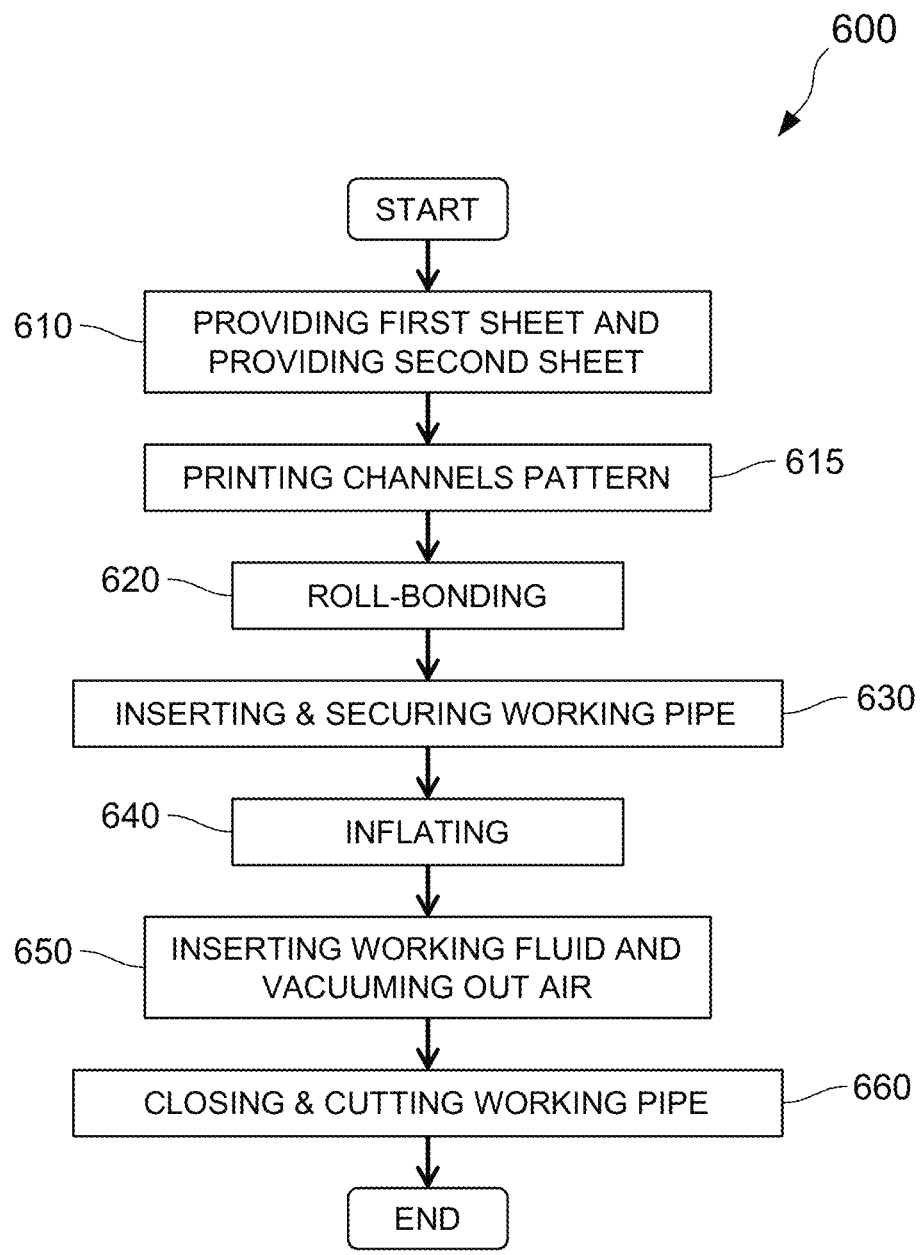
FIG. 6 is a flow chart of a manufacturing method of heat exchanger fins, according to embodiments of the disclosure.

In some embodiments, each heat exchanger fin 100 is made of aluminum, or an aluminum-alloy or the like, and formed by roll-bonding or similar processes. FIG. 6 is a flow chart of a manufacturing method 600 of the heat exchanger fin 100 of FIG. 2A, according to embodiments of the disclosure. The method 600 can also be used to manufacture fins 300, 400, and 500. Referring to FIG. 6, the method 600 includes a first operation 610 that includes providing a first metal sheet and a second metal sheet. In some embodiments, the first and second metal sheets are metal coils, unrolled through an unwinder and then aligned by a suitable roller stand. Next, in operation 615, a pattern including a condensation channel, a connecting channel, and an evaporation channel, and network of channels is printed on the first metal sheet. In some embodiments, the sheets are cleaned and then printed by a screen printing process using a graphite pattern to define the network of channels, the condensation channel 162, the connecting channel 172, and the evaporation channel 122.

In some embodiments, each heat exchanger fin 100 further includes a working channel 916 of a working section 918, extending from the channels 116 to an edge of the heat exchanger fin 100. In some embodiments, the screen printing process employing the graphite pattern also prints the extended working channel 916. Following, in operation 620, the inner surface of the first metal sheet and the inner surface of the second metal sheet are integrally bonded in areas other than the channel printed areas.

The graphite serves as a release agent, thus, preventing the first and second metal sheets from integrally bonding in the areas of the patterned network of channels. However, other types of materials can also be used as the release agent provided the materials prevent the first and second metal sheets from integrally bonding in the areas of the channels after a roll-bonding operation (S620).

In some embodiments, the thickness of the first and second metal sheets is around 0.250 mm to around 3.00 mm, and the roll bonding process reduces the combined thickness of the metal sheets (the clad material) by around 40% to 60%. However, the thicknesses of the sheets and the combined thickness after roll bonding can be varied (increased or decreased) depending upon the material, original thickness of the sheets, number of sheets, processes employed, and design requirements for effective and efficient thermal performance.

In some embodiments, the heat exchanger fins 100, 300, 400, and 500 are quadrilateral shaped, However, the embodiments are not limited in this regard, and the heat exchanger fins may be any desired shape, and as required by application and design requirements as long as a pressure differential is created in the fins to generate self-sustaining turbulent driving forces that cause the working fluid to flow in the channels.

Figure 7A:
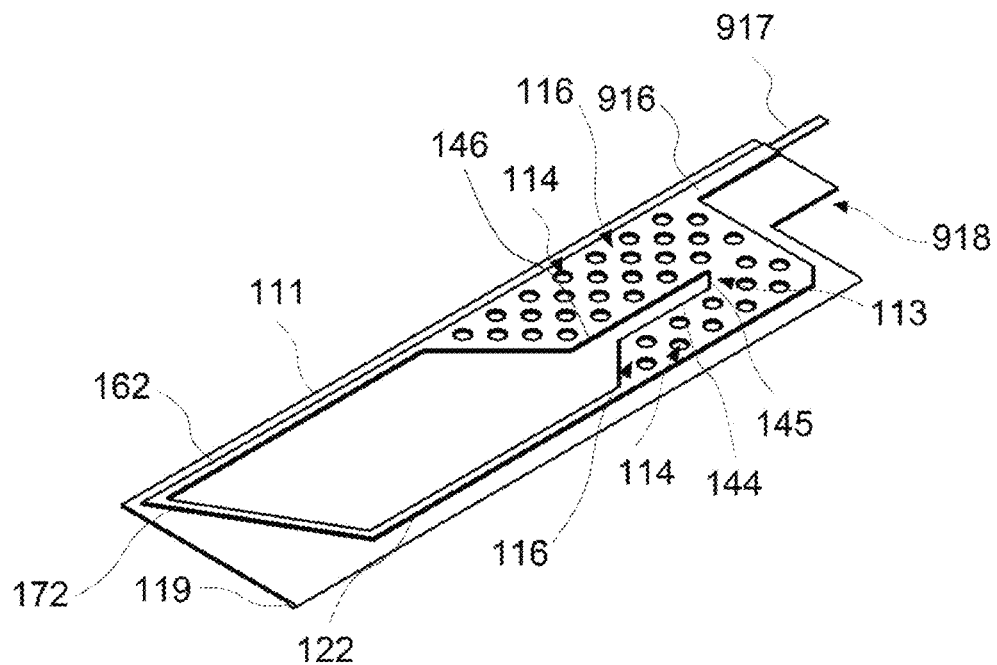
FIG. 7A is a perspective view of the heat exchanger fin of FIG. 1A and FIG. 1B following an operation of the manufacturing method of FIG. 6, according to embodiments of the disclosure.

FIG. 7A is schematic drawing of a perspective view of the heat exchanger fin 100 of FIG. 1A and FIG. 1B following operation 620 of the manufacturing method 600 of FIG. 6, according to embodiments of the disclosure. Referring to FIG. 7A, with continued reference to FIG. 6, in operation 630, a working pipe 917 is inserted and secured to the working channel 916, extending from the end of the working section 918. The working pipe 917 allows for communication with the outside atmosphere and the condensation channel, connecting channel, evaporation channel, and the network of channels. In operation 640, the channels 116, the condensation channel 162, the connecting channel 172, and the evaporation channel 122 are inflated by introducing a fluid (e.g., gas or liquid) having a pressure that provides even inflation throughout the heat exchanger fin 100. In some embodiments, the gas is atmospheric air having a suitable pressure for inflation. In other embodiments, the gas may be nitrogen, oxygen, argon, hydrogen, carbon dioxide, or any other suitable gas or mixtures thereof. In some embodiments, the first and second metal sheets 183, 187 are inserted into a mold before inflating for even inflation throughout each heat exchanger fin 100.

In some embodiments, the radius (or height) of the condensation channel, the connecting channel, the evaporation channel, and the network of the channels is around 0.125 mm to around 1.50 mm. However, embodiments are not limited in this regards and the radius of the condensation channel, connecting channel, evaporation channel, and network of channels can be varied (increased or decreased) depending upon the material, original thickness of the metal sheets, number of sheets, processes used, and design requirements for effective and efficient thermal performance.

Figure 7B:
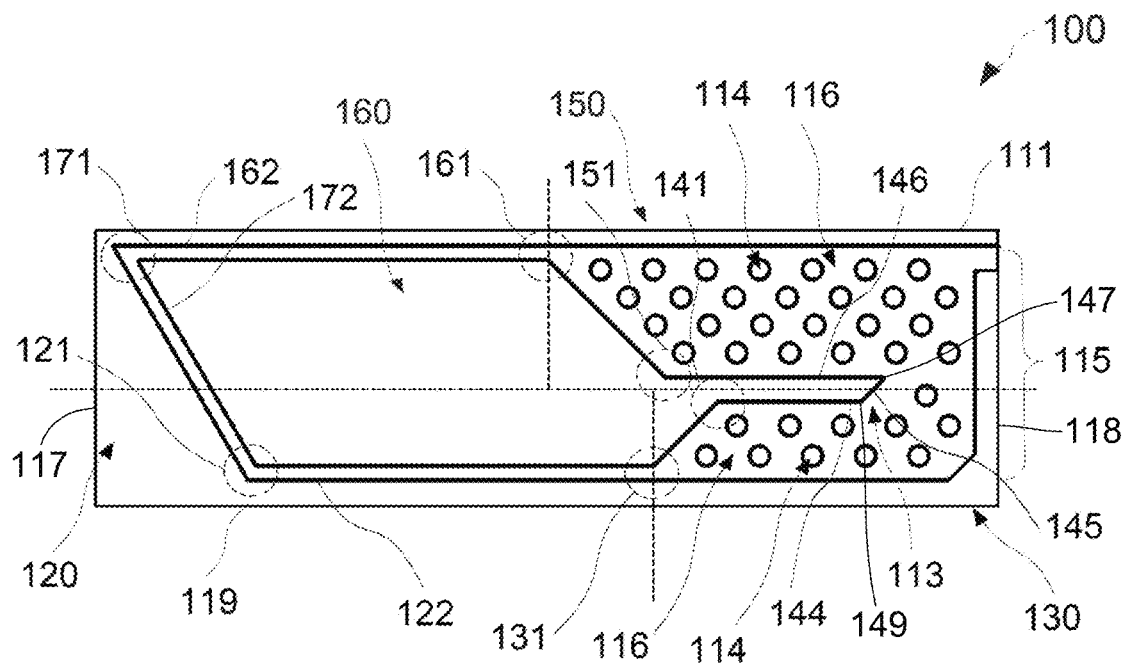
FIG. 7B is a plan view of the heat exchanger fin of FIG. 7A following an operation of the manufacturing method of FIG. 6, according to embodiments of the disclosure.

Next, in operation 650 a working fluid is introduced into the working pipe and air is vacuumed out. FIG. 7B is a plan view of the heat exchanger fin of FIG. 7A following operation 660 of the manufacturing method 600 of FIG. 6, according to embodiments of the disclosure. Referring to FIG. 7B, in operation 660, the working pipe 917 is closed and sealed by flattening and bonded, and after cooling, the working channel 916 and the working pipe 917 are cut and the heat exchanger fin 100 is obtained.

In some embodiments, the diameter of the plurality of obstructers 114 is around 0.500 mm to around 6.00 mm. The obstructers 114 can have the same diameter or different diameter. However, the diameter can be increased or decreased depending upon the material, original thickness of the metal sheets, number of sheets, processes used, and design requirements for effective and efficient thermal performance, as long as the channels 116 formed by the plurality of obstructers 114 increase the creation of the non-equilibrium pressure condition within the channels 116 and maintain the self-sustaining turbulent driving forces therein.

In some embodiments, the first metal sheet 183 and second metal sheet 187 are made of aluminum, or an aluminum-alloy or the like, and formed bonded by roll-bonding. However, in other embodiments, other manufacturing processes, such as stamping can be used to bond the first metal sheet 183 and second metal sheet 187 depending on material and manufacturing requirements. In some embodiments, the first metal sheet 183 and/or the second metal sheet 187 may be made of copper, or a copper-alloy, or other malleable heat conducting metal having a high thermal conductivity as required by application and design requirements.

In some embodiments, the base plate 190 is made of aluminum, or an aluminum-alloy, or any other material that can be used in a brazing technique for brazing of each fin base 119 of each heat exchanger fin 100 to each mounting groove 192. In other embodiments, the base plate 190 may also be made of copper, or a copper-alloy, or other malleable heat conducting metals having a high thermal conductivity as required by application and design requirements and as long as each fin base 119 can be thermally and mechanically mounted to each mounting groove 192.

In some embodiments, the base plate 190 is made of a solid malleable metal heat conducting material having a relatively high thermal conductivity. In some embodiments, the base plate 190 is under vacuum, and has a working fluid therein. In some embodiments, the base plate 190 has an inlet and an outlet, having working fluid flowing therein.

In some embodiments, when a stamping process or the like is used to form the heat exchanger fin 100, any desired bonding method, such as ultrasonic welding, diffusion welding, laser welding and the like, can be employed to bond and integrally form the first and second inner surfaces together at areas other than the areas including the condensation channel, connecting channel, and evaporation channel, and network of channels.

In some embodiments, when a stamping process or similar is employed, depending upon dimensions and application, axial or circumferential wick structures, having triangular, rectangular, trapezoidal, reentrant, etc. cross-sectional geometries, may be formed on inner surfaces of one or more of the condensation channel, the connecting channel, the evaporation channel, and the network of channels. The wick structure may be used to facilitate the flow of condensed fluid by capillary force back to the evaporation surface, keeping the evaporation surface wet for large heat fluxes.

In other embodiments, further heat treatment processes can be employed throughout the manufacturing method of the heat exchanger fin 100. Additionally, one or more additional steps can be added to the process in order to incorporate additional features into the finished product. Also, the order of operations can be altered or new operations can be added or some of the operations can be performed simultaneously. For example, other operations can include operations of alloying, casting, scalping and pre-heating, operations such as annealing; and operations such as solution heat treatment or final annealing, stretching, leveling, slitting, edge trimming and aging, and the like.

In some embodiments, the heat exchanger fin 100 includes a one sided inflated roll-bonded sheet having the condensation channel, connecting channel, evaporation channel, and network of channels. In alternative embodiments, one or more heat exchanger fins 100 can include the at least one condensation channel, connecting channel, evaporation channel, and network of channels on two sides thereof via two one sided inflated roll-bonded sheets. In other embodiments, a single heat exchanger fin 100 including the one sided inflated roll-bonded sheet having the condensation channel, connecting channel, evaporation channel, and network of channels, may be employed as a stand-alone heat exchanger.

In some embodiments, the working fluid includes acetone cyclopentane or n-hexane, or any other desired working fluid as long as the working fluid can be vaporized by a heat source and the vapor can condense back to the working fluid and flow back to the heat source.

Figure 8:
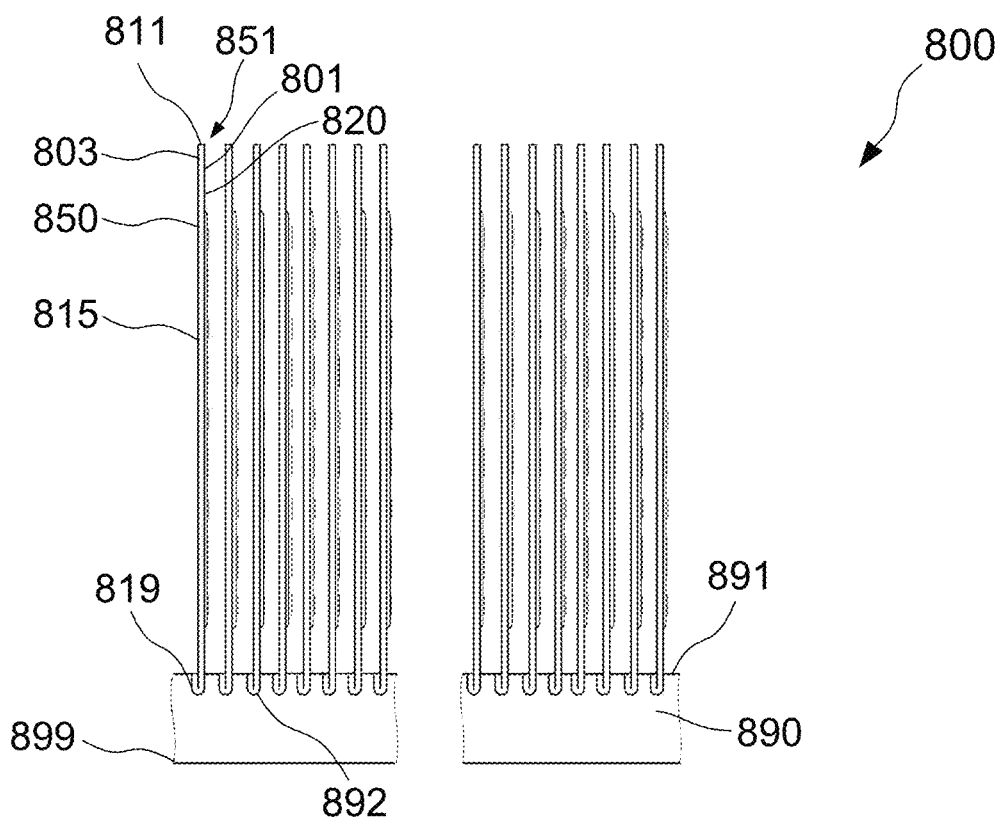
FIG. 8 is a schematic perspective view of a heat exchanger, according to embodiments of the disclosure.

FIG. 8 is a schematic perspective view of a heat exchanger 800, according to embodiments of the disclosure. The heat exchanger 800 is an example of a heat dissipation device used to dissipate heat generated by one or more electronic devices (e.g., circuits, processors, etc.). Although embodiments are discussed with reference to a heat exchanger, embodiments are equally applicable to other types of heat dissipation devices without departing from the scope of the disclosure. Referring to FIG. 8, the heat exchanger 800 includes a plurality of heat exchanger fins 851 arranged on a base plate 890. Each heat exchanger fin 851 is a longitudinally extending structure having a fin body 815 formed from a first metal sheet 850 and a second metal sheet 820 coupled to each other. The fin body 815 includes a fin base 819 along a first longitudinal edge and a fin edge 811 defining a second longitudinal edge of the fin 851 opposite the fin base 819. The base plate 890 includes a mounting surface 891 and a contact surface 899 opposite the mounting surface 891. The mounting surface 891 includes a plurality of mounting grooves 892 arranged substantially parallel to each other and evenly spaced from each other.

Each mounting groove 192 is sized and shaped, or otherwise configured, to receive the fin base 819 of corresponding heat exchanger fin 851. The fin base 819 of each heat exchanger fin 851 is thermally and mechanically coupled to each mounting groove 892 using adhesion techniques, such as brazing. However, other suitable techniques for thermally and mechanically coupling the fins can be used. In some embodiments, each fin base 819 is hemmed (or bent), reinforcing the strength thereof and increasing the surface area for conductive heat transfer from the base plate 890 to the plurality of heat exchanger fins 100.

The area occupied by the plurality of heat exchanger fins 851 on the mounting surface 891 varies depending upon application and design requirements. For example, the area occupied by the fins 851 may be smaller, resulting in a non-occupied (empty) space on the mounting surface 891, or the area occupied by the fins 851 may be larger when the spacing between adjacent fins 851 is increased.

In some embodiments, the thickness of the first and second metal sheets 850 and 820 is around 0.250 mm to around 3.00 mm.

One or more heat sources, e.g., electronic devices are coupled to the contact (or bottom) surface 899, for example, using fasteners and or other suitable means. In addition, to improve thermal conduction between the electronic devices and the base plate 890, thermal paste or similar is used when coupling the electronic devices to the base plate 890.

Figure 9A:
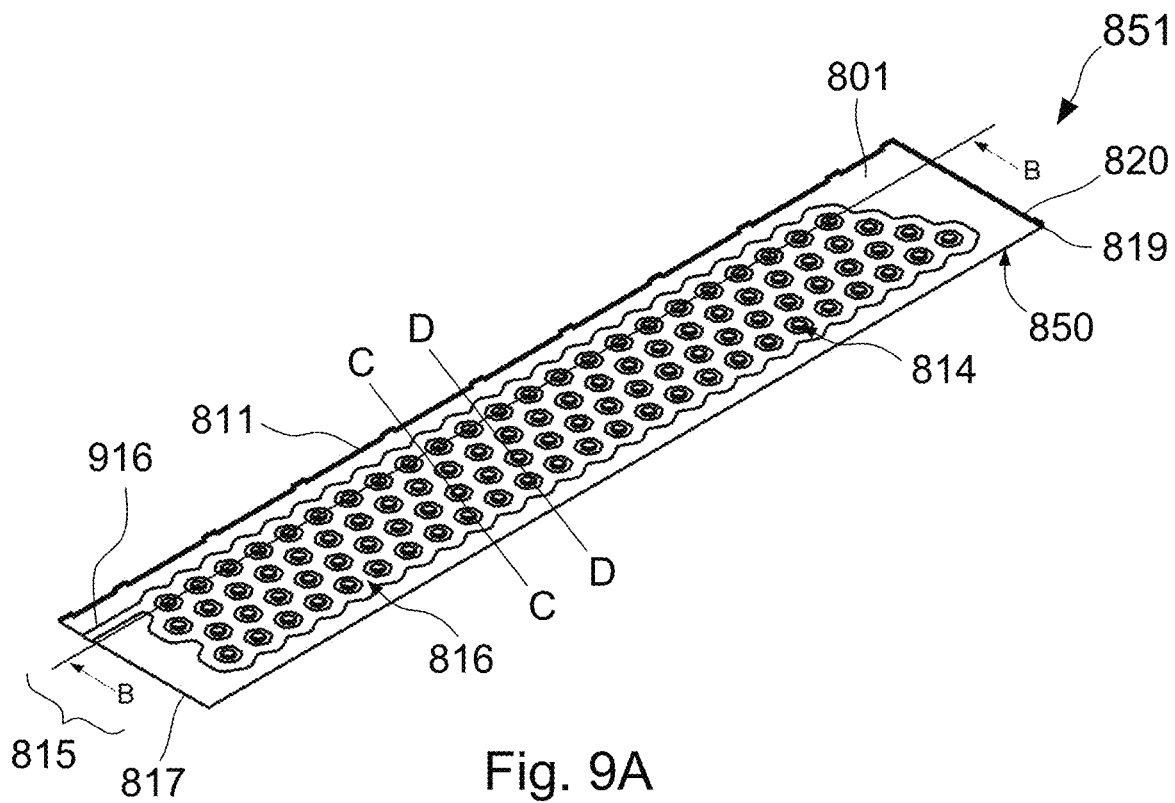
FIG. 9A is schematic perspective first view of a heat exchanger fin of the heat exchanger of FIG. 8, according to embodiments of the disclosure.
Figure 9B:
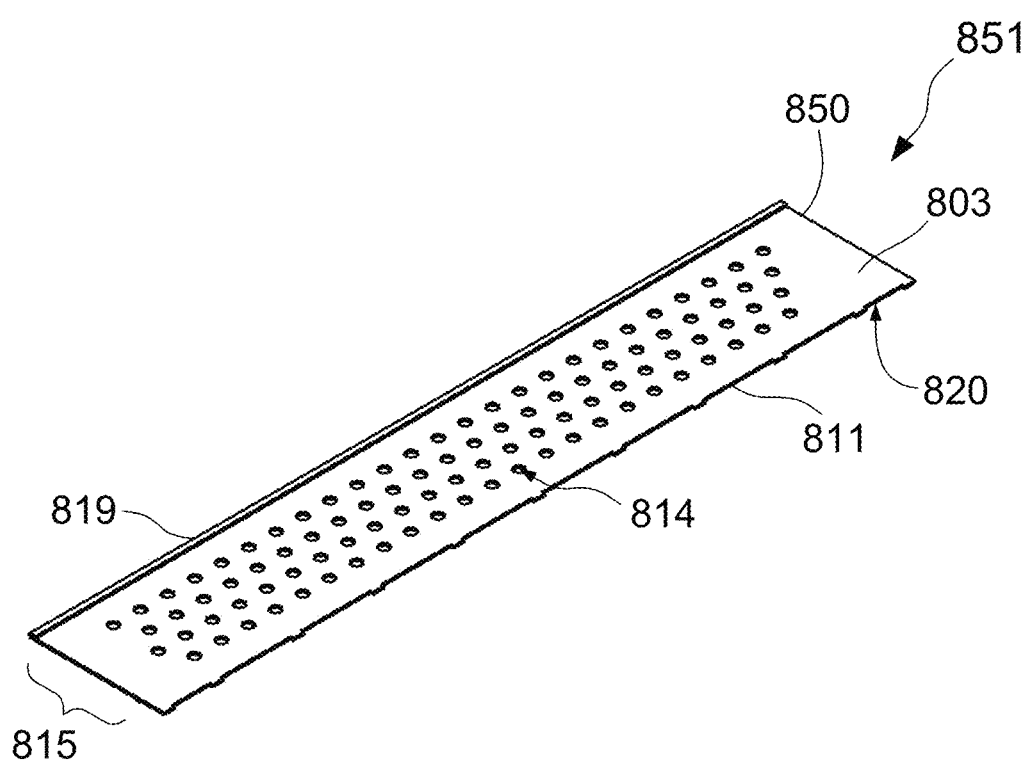
FIG. 9B is schematic perspective second view of the heat exchanger fin of FIG. 9A, according to embodiments of the disclosure.

FIG. 9A is schematic perspective view of a heat exchanger fin 851 of the heat exchanger 800 of FIG. 8 illustrating an outer surface 801 of the first metal sheet 820 of the fin 851, according to embodiments of the disclosure. FIG. 9B is schematic perspective view of heat exchanger fin 851 of FIG. 9A illustrating an outer surface 803 of the second metal sheet 850 of the fin 851, according to embodiments of the disclosure. Referring to FIGS. 9A and 9B, and with continued reference to FIG. 8, the fin body 815 of each heat exchanger fin 851 includes a plurality of airflow through holes 814 formed through the fin body 815 and extending from the outer surface 801 to the outer 803. The through holes 814 define a network of channels 816 (also referred to as braided channels). The airflow through holes 814 are generally circular-shaped and arranged in a staggered configuration. However, the shape and size of the holes 814 is not limited to any particular shape and size. For instance, the holes 814 can be polygonal shape. The holes 814 can be arranged in any desired configuration (staggered or non-staggered) and the separation (pitch) between adjacent holes 814 can be varied (increased or decreased) as required by application and design.

In the absence of the through holes 814, air between adjacent heat exchanger fins 851 insulates the surfaces of the adjacent facing heat exchanger fins 851 and the base plate surfaces therebetween. This air is relatively stagnant and does not flow freely between the fins. As a result, heat dissipation is poor and thus thermal performance of heat exchangers decreases. The availability of only natural convection and the reduced distance between the heat exchanger fins further decrease heat dissipation. The plurality of airflow through holes 814, according to embodiments of the disclosure, result in air flowing through in the through holes 814 and between adjacent fins 851. This air flow is transverse to the air flowing longitudinally across the surfaces of each heat exchanger fin 851 along the fin base 119. The transverse air flows create a turbulent airflow and thus reduces the presence of stagnant air between heat exchanger fins 851. By reducing stagnant air using the plurality of airflow through holes 814, the distance (separation) between the plurality of heat exchanger fins 100 can be reduced without sacrificing heat dissipation and thermal performance even when only natural convection is available. As a result, the average amount of heat transferred from each square centimeter of surface area of the plurality of heat exchanger fins 1000 is increased.

In some embodiments, each heat exchanger fin 851 is quadrilateral shaped. However, the heat exchanger fins 851 can have any shape other than shape, e.g., polygonal, without departing from the scope of the disclosure.

In some embodiments, each heat exchanger fin 851 further includes a working channel 916 that connects the channels 816 to peripheral edge 817 of a heat exchanger fin 851. The working channel 916 is used to introduce working fluid into the channels 816 and for inflating the fin 851 during the manufacturing process.

Figure 10:
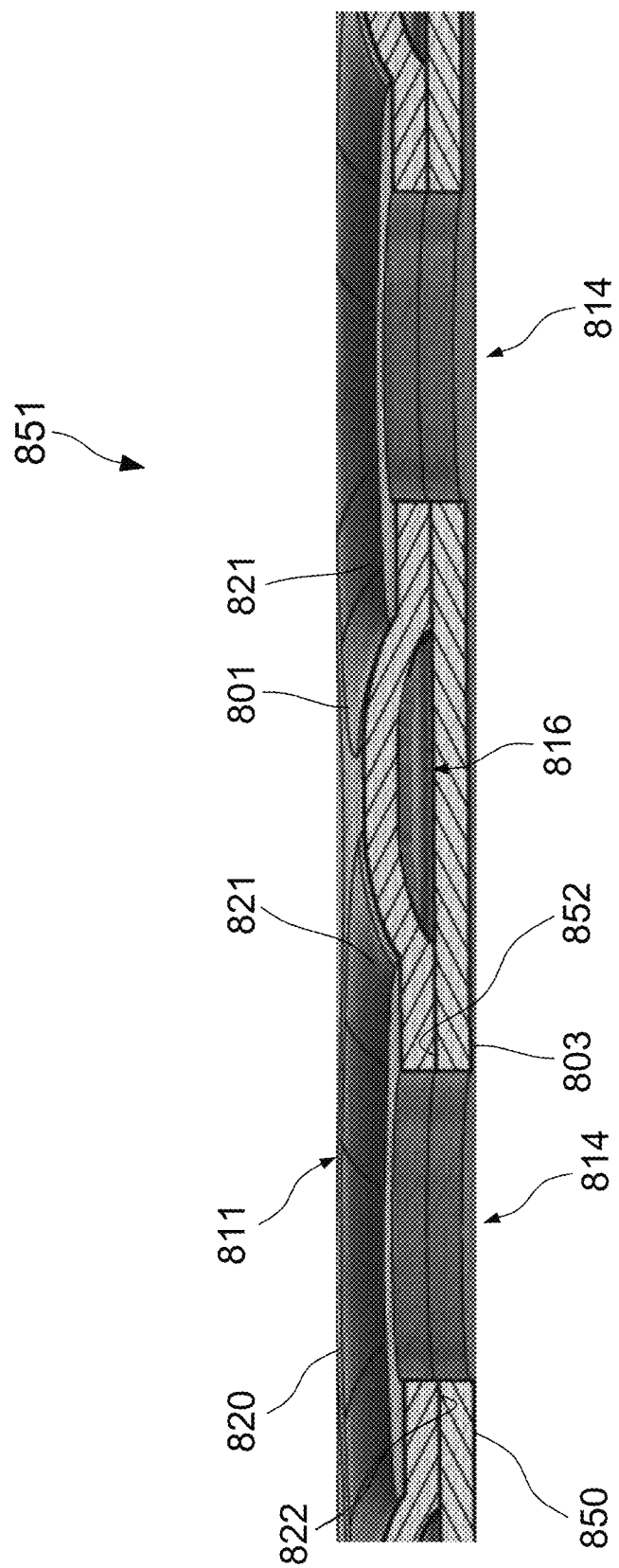
FIG. 10 is a partial cross-sectional view of the heat exchanger fin of FIG. 9A along line B-B and between lines C-C and D-D of FIG. 9A, according to embodiments of the disclosure.

FIG. 10 is a partial cross-sectional view of the heat exchanger fin 851 of FIG. 9A along line B-B and between lines C-C and D-D of FIG. 9A, according to embodiments of the disclosure. Referring to FIG. 10, with continued reference to FIGS. 8-9B, the first metal sheet 850 includes a surface 852 and the second metal sheet 820 includes an inner surface 822. The inner surface 852 contacts the inner surface 822 except in locations where the channels 816 are located. The inner surface 852 and the inner surface 822 cooperatively define the channels 816.

The plurality of airflow through holes 814 are defined in locations where the inner surface 852 contacts the inner surface 822. The first metal sheet 850 and the second metal sheet 820 cooperatively define each airflow through hole 814 in locations where the inner surface 852 contacts the inner surface 822. In some embodiments, and as illustrated, each airflow through hole 814 is located in a recess 821 formed in the surface 801 of the second metal sheet 820.

Referring to FIGS. 9A and 10, the channels 816 and the plurality of airflow through holes 814 are formed in a region 830 of each fin 851 that is separated from the edges of the fin 851. Outside the region 830, the fin 851 does not include airflow through holes 814, and the inner surface 852 and the inner surface 822 are in continuous contact with each other.

In some embodiments, the plurality of heat exchanger fins 100 are under vacuum and include a working fluid. In some embodiments, the working fluid is in the form of liquid vapor slugs/bubbles in the channels 816. In general, each heat exchanger fin 851 includes an evaporator region, a condenser region, and vapor flow channel regions extending between the evaporator region and the condenser region. When heat from at least one heat source is applied to the evaporator region, the heat converts the working fluid to vapor and the vapor expands within the heat exchanger fin 851. Meanwhile, at the condenser region, heat is being removed and the vapor is condensed. The volume expansion due to vaporization and the contraction due to condensation cause a turbulence motion via the channels 816. The net effect of the temperature gradient between the evaporator region and the condenser region, and the driving forces due to the different vapor flow paths created by the channels 816 creates a non-equilibrium pressure condition. Thus, thermo-fluidic transport is provided via self-sustaining turbulent driving forces, having pressure pulsations being fully thermally driven.

The plurality of heat exchanger fins 100 under vacuum and including a working fluid in the channels 816 increases heat dissipation and thermal performance of the fins 100 compared to heat exchanger fins not including a working fluid. The channels 816 formed by the plurality of airflow through holes 814 having staggered pitch increases the creation of non-equilibrium pressure conditions, strengthening the self-sustaining turbulent driving forces within the channels 816. In addition, the heat exchanger fins 100 minimize formation of a layer of heated air on the surface of base plate 890 that impedes heat transfer.

In some embodiments, the first and second inner surfaces 852 and 822 of each fin 851 are bonded together at portions of the fin 851 that do not include the channels 816. In some embodiments, each heat exchanger fin 851 is made of aluminum, or an aluminum-alloy or the like, and formed by roll-bonding.

Figure 11:
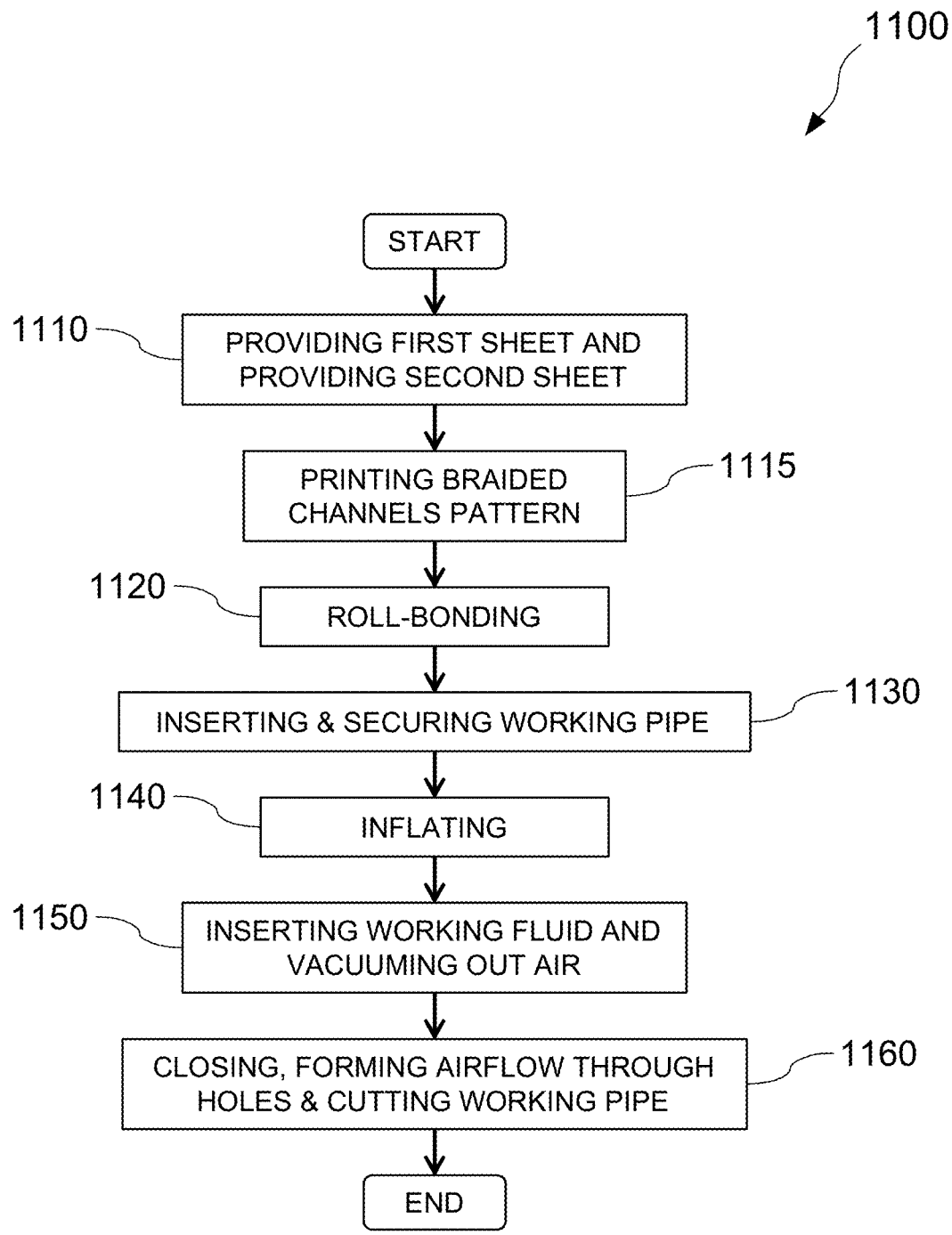
FIG. 11 is a flow chart illustrating a manufacturing method of the heat exchanger fin of FIG. 9A, according to embodiments of the disclosure.

FIG. 11 is a flow chart illustrating a manufacturing method 1100 of the heat exchanger fin 851 of FIG. 9A, according to embodiments of the disclosure. Referring to FIG. 11, with continued reference to FIGS. 8 to 10, the method 1100 of manufacturing each heat exchanger fin 851 includes an operation 1110 of providing a first metal sheet 850 and a second metal sheet 820. In some embodiments, the first and second metal sheets are metal coils that are unrolled using an unwinder and then aligned by a suitable roller stand. Next, in operation 1115, a pattern of channels 816 is printed on the first metal sheet 850 (or alternatively on the second metal sheet 820). In some embodiments, the sheets are cleaned and then printed by a screen printing process using a graphite pattern of the channels. In some embodiments, the screen printing process using the graphite pattern also prints the working channel 916. Following, in operation 1120, the inner surface 852 of the first metal sheet 850 and inner surface 822 of the second metal sheet 820 are integrally bonded in areas other than areas where the channels are printed.

Those of ordinary skill in the relevant art will understand that graphite serves as a release agent, thus preventing the first and second metal sheets from bonding together in the areas of the patterned channels. However, embodiments are not limited in this regard and other types of materials (or methods) can also be used as release agents to selectively bond the first and second metal sheets.

In some embodiments, the thickness of each of the first and second metal sheets 850, 820 can be reduced to around 40% to 60%. However, embodiments are not limited in this regard. In other embodiments, the thickness can be reduced to less than 40% or more than 60% depending upon the material of the metal sheets, the original thickness of the sheets, the number of sheets bonded, and application and design requirements.

Next, in operation 1130 a working pipe is inserted and secured to the working channel 916. The working pipe provides for communication between the channels 816 and the external atmosphere. Following, in operation 1140, the channels are inflated by introducing a fluid (e.g., gas or liquid) having a pressure that causes even inflation throughout each heat exchanger fin 851. In some embodiments, the fluid includes atmospheric air having a pressure suitable for inflation. In other embodiments, the fluid include nitrogen, oxygen, argon, hydrogen, carbon dioxide, or mixtures thereof. In some embodiments, the fluid includes a liquid under pressure. In some embodiments, the first and second metal sheets 850, 820 are inserted into a mold before inflating for even inflation throughout each heat exchanger fin 851.

In some embodiments, the cross-sectional width of the channels 816 is around 0.125 mm to around 1.50 mm. However, embodiments are not limited thereto, and the width of the channels 816 can be increased or decreased depending upon the material of the sheets, original thickness of the sheets, the number of sheets bonded, and application and design requirements, without departing from the scope of the disclosure.

Next, in operation 1150 a working fluid is introduced into the channels 816 via the working pipe and the fluid used to inflating is vacuumed out. In operation 1160, the working pipe is closed and sealed by flattening and then bonding the metals sheets together. After cooling, the working pipe is cut and the plurality of airflow through holes are formed, e.g., using a punching process, in the locations where the metal sheets 820 and 850 are bonded to each other.

In some embodiments, the diameter of the plurality of airflow through holes 814 is the same and is around 0.500 mm to around 6.00 mm. However, the diameter can be increased or decreased depending upon the material of the sheets original thickness of the sheets, the number of sheets bonded, and application and design requirements, without departing from the scope of the disclosure.

In some embodiments, the first metal sheet 850 and the second metal sheet 820 are made of aluminum, or an aluminum-alloy or the like, and formed by roll-bonding. However, in other embodiments the first metal sheet 850 and the second metal sheet 820 are formed by other methods such as stamping. In other embodiments, the first metal sheet 850 and the second metal sheet 820 are made of copper, or a copper-alloy or the like, or other malleable metal heat conducting material having a relatively high thermal conductivity.

In some embodiments, the base plate 890 is made of aluminum, or an aluminum-alloy or the like that is suitable for utilizing a brazing technique for thermal and mechanical brazing the fin base 819 of each heat exchanger fin 851 to a mounting groove 892. However, in other embodiments the base plate 890 is made of copper, or a copper-alloy or the like, or other malleable metal heat conducting material having a relatively high thermal conductivity provided each fin base 819 can be thermally and mechanically mounted to the mounting groove 892.

In some embodiments, the base plate 890 is made of a solid malleable metal heat conducting material having a relatively high thermal conductivity. In other embodiments, the base plate 890 is under vacuum, and includes a working fluid therein. In still other embodiments, the base plate 890 has an inlet and an outlet for introducing the working fluid and for removing the working fluid.

In some embodiments, when a stamping process is used to form each heat exchanger fin 851, a bonding method such as ultrasonic welding, diffusion welding, laser welding and the like, can be used to bond and integrally form the first and second inner surfaces 852 and 822.

In some embodiments, an axial or circumferential wick structure having triangular, rectangular, or trapezoidal cross-sectional geometries, is formed on inner surfaces of the channels 816. The wick structure is used to facilitate the flow of condensed fluid by capillary force back to the evaporation surface, keeping the evaporation surface wet for large heat fluxes.

Those of ordinary skill in the relevant art will understand that further heat treatment processes can be employed throughout the manufacturing method of each heat exchanger fin 851, and the embodiments are not limited to those described herein. Additional operations can be added to the process in order to incorporate additional features into the finished product. Also, the order of the operations can be changed. For example, operations of alloying, casting, scalping and pre-heating, intermediate annealing, and operations such as solution heat treatment or final annealing, stretching, leveling, slitting, edge trimming and aging, and the like can be used.

In some embodiments, each heat exchanger fin 851 includes a one sided inflated roll-bonded sheet having channels 816. In other embodiments, each heat exchanger fin 851 may include channels on two sides thereof via two one sided inflated roll-bonded sheets. In other embodiments, each heat exchanger fin 851 including the one sided inflated roll-bonded sheet having channels 816 is used as a stand-alone heat exchanger. In some embodiments, the working fluid includes acetone. Other working fluids including cyclopentane or n-hexane can also be used.

Figure 12A:
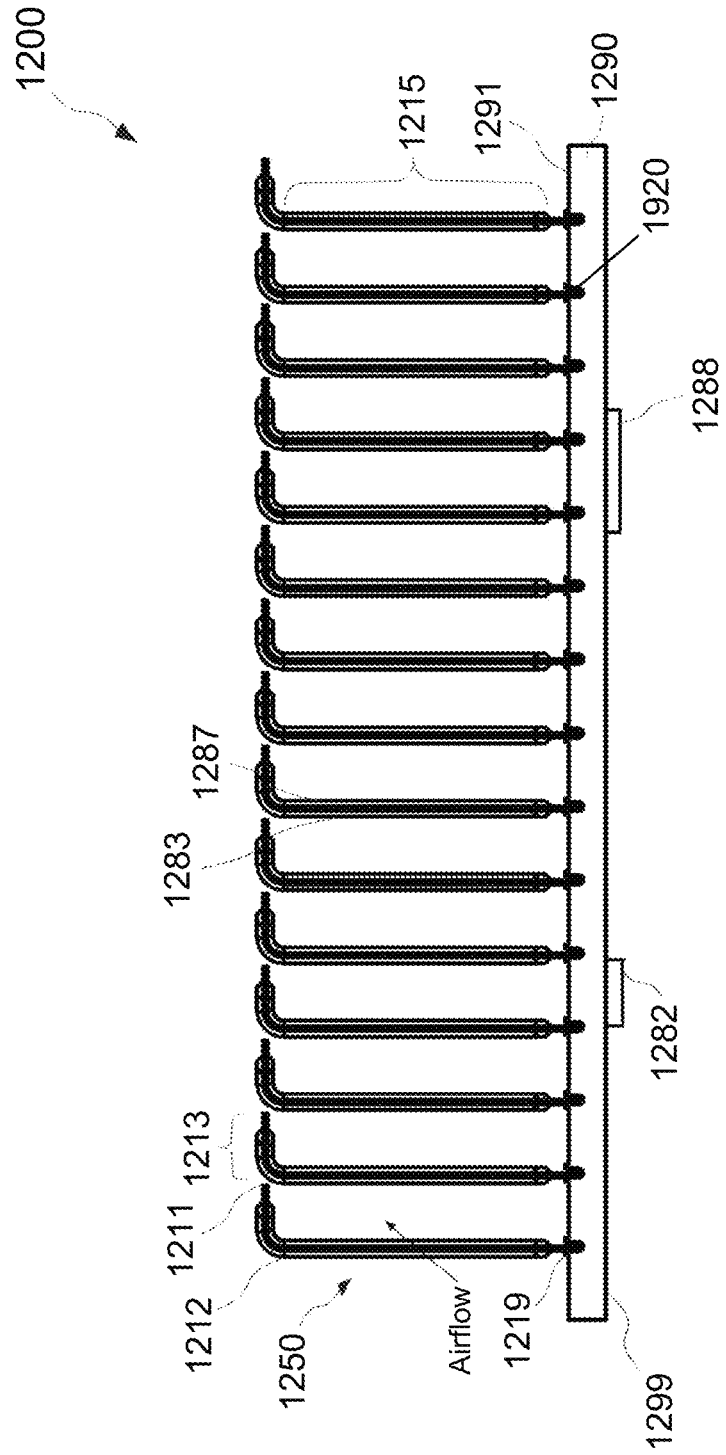
FIG. 12A is a side view of a heat exchanger in the direction of arrow M, according to embodiments of the disclosure.
Figure 12B:
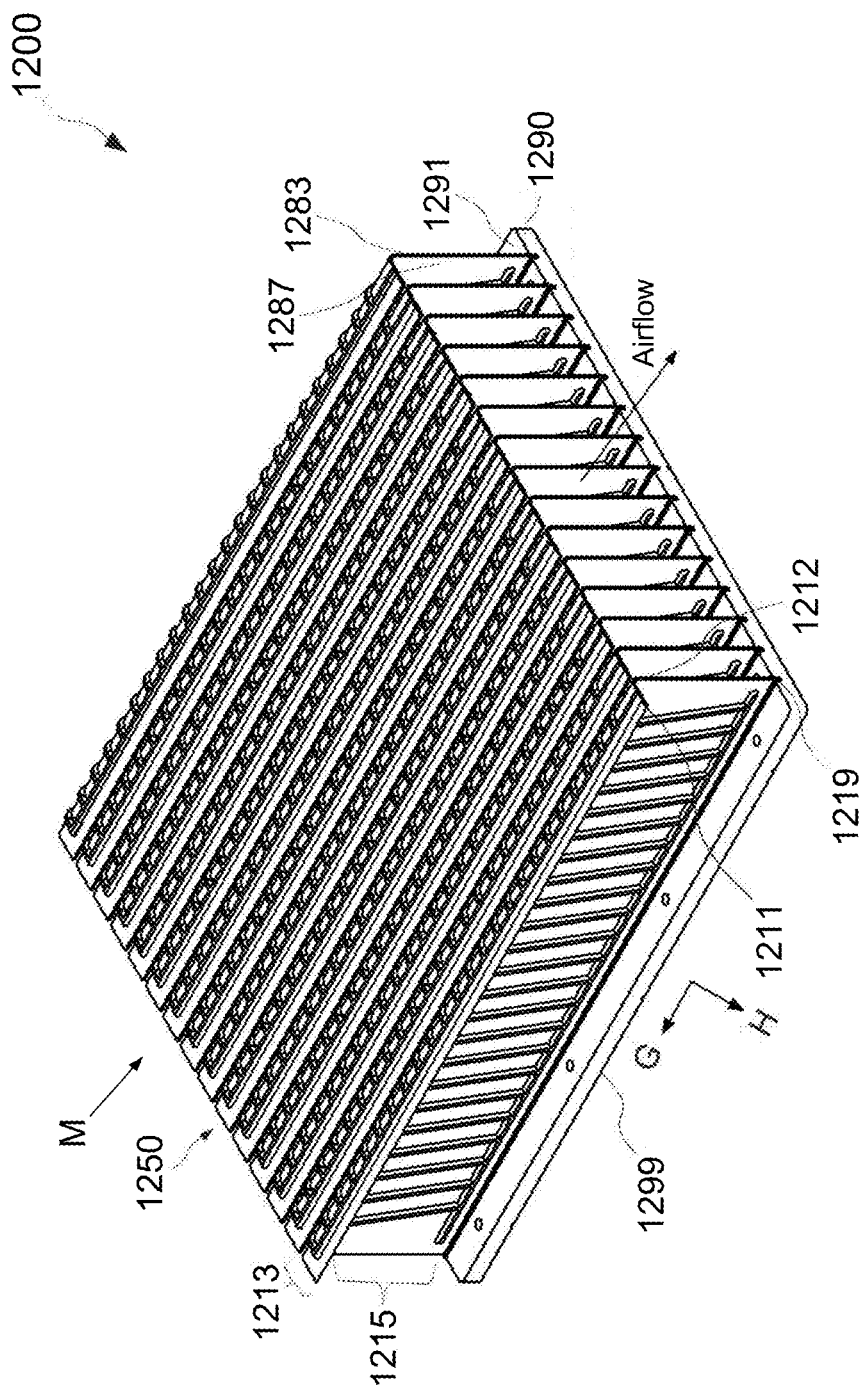
FIG. 12B is a schematic perspective of the heat exchanger in FIG. 12A, according to embodiments of the disclosure.

FIG. 12A is a side view of a heat exchanger 1200 in FIG. 12B in the direction of arrow M, according to embodiments of the disclosure. FIG. 12B is a schematic perspective view of a heat exchanger 1200, according to embodiments of the disclosure. The heat exchanger 1200 is an example of a heat dissipation device used to dissipate heat generated by one or more electronic devices (e.g., circuits, processors, etc.) coupled thereto. Although embodiments are discussed with reference to a heat exchanger, embodiments are equally applicable to other types of heat dissipation devices without departing from the scope of the disclosure. Referring to FIGS. 12A and 12B, the heat exchanger 1200 includes a plurality of heat exchanger fins (or fin blades) 1250 installed on a base plate 1290. Each heat exchanger fin 1250 includes a fin base 1219, a fin intermediate 1212 and a fin tip 1211. Each fin 1250 is a bent structure (L-shaped) including an exchanger enhancement portion 1215 disposed transverse (e.g., having angle greater than 0° and less than 180°) to the base plate 1290 and an auxiliary enhancement portion 1213 extending transversely (e.g., having angle greater than 0° and less than 180° from the exchanger enhancement portion 1215. Thus, referring to orientation in FIGS. 12A and 12B, the exchanger enhancement portion 1215 forms the vertical portion of the fin 1250 and the auxiliary enhancement portion 1213 forms the horizontal portion of the fin 1250. The auxiliary enhancement portion 1213 is connected to the exchanger enhancement portion 1215 via a bend (or curve) 1270.

However, it should be noted that the angle of the exchanger enhancement portion 1215 with reference to the base plate 1290 can be greater than 0° or less than 90° and the angle of the auxiliary enhancement portion 1213 with reference to the exchanger enhancement portion 1215 can be greater than 0° or less than 90°, without departing from the scope of the disclosure. The base plate 1290 includes a mounting surface 1291 and a contact surface 1299 opposite the mounting surface 1291. The mounting surface 1291 has a plurality of mounting grooves 1920, each of which is sized and shaped, other otherwise configured, to receive and secure therein a corresponding fin 1250. The mounting grooves 1920 are arranged substantially parallel to each other and spaced apart at even or regular intervals (or, in some embodiments, at irregular intervals).

Each mounting groove 1920 receives in it a fin base 1219 of each heat exchanger fin 1250. The fin base 1219 of each heat exchanger fin 1250 is thermally and mechanically attached (e.g., permanently) to each mounting groove 1920 by brazing techniques. However, other methods may be used as long as heat is efficiently transferred from the base plate 1290 to the plurality of heat exchanger fins 1250. In some embodiments, each fin base 1219 is hemmed to improve the strength thereof and increase the surface area of the fin 1250 in contact with the base plate 1290 for increasing heat transfer from the base plate 1290 to the heat exchanger fins 1250.

The area occupied by the heat exchanger fins 1250 on the mounting surface 1291 may depend upon application and design requirements. As an example, in some embodiments, the fins 1250 are closely placed to each other and thus the area occupied by the fins 1250 on the mounting surface 1291 is smaller, resulting in portions of the mounting surface 1291 surrounding the fins 1250 that are not occupied by the fins 1250.

One or more electronic devices (heat sources) are attached to the contact surface 1299, for example, using fasteners (nut, bolts, screws, pins, clips etc.). In some embodiments, a thermal paste is used when attaching the electronic devices to the contact surface 1299 for improved heat transfer.

In some embodiments, a first heat source 1282 and a second heat source 1288 are attached to the contact surface 1299 of the base plate 1290. The power requirement and maximum operating temperature allowance of the first heat source 1282 may be less than that of the second heat source 1288 and in operation, the first heat source 1282 is located lower (closer to ground G (or base) transverse to the horizontal (H) level) than the second heat source 1288 when the when the heat exchanger 1200 is installed in an upright (vertical) position. With reference to the orientation of the heat exchanger 1200 in FIG. 12B, when the heat exchanger 1200 is installed in an upright (vertical) position, the left side ends of the base plate 1290 and the fins 1250 are closer to the ground G. However, embodiments are not limited thereto and more than two sources of heat can be coupled to the base plate 1290.

Figure 13A:
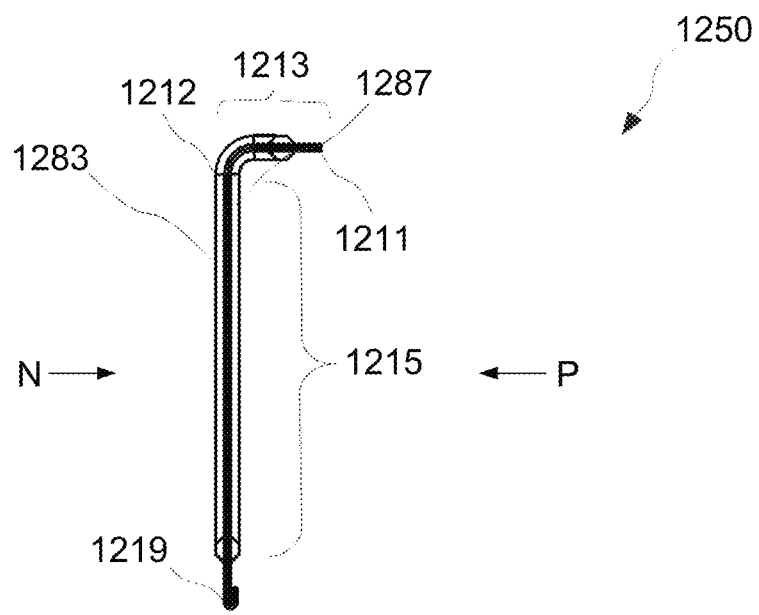
FIG. 13A is a side view of a heat exchanger fin of the heat exchanger of FIG. 12A and FIG. 12B in the direction of arrow M in FIG. 12B, according to embodiments of the disclosure.
Figure 13B:
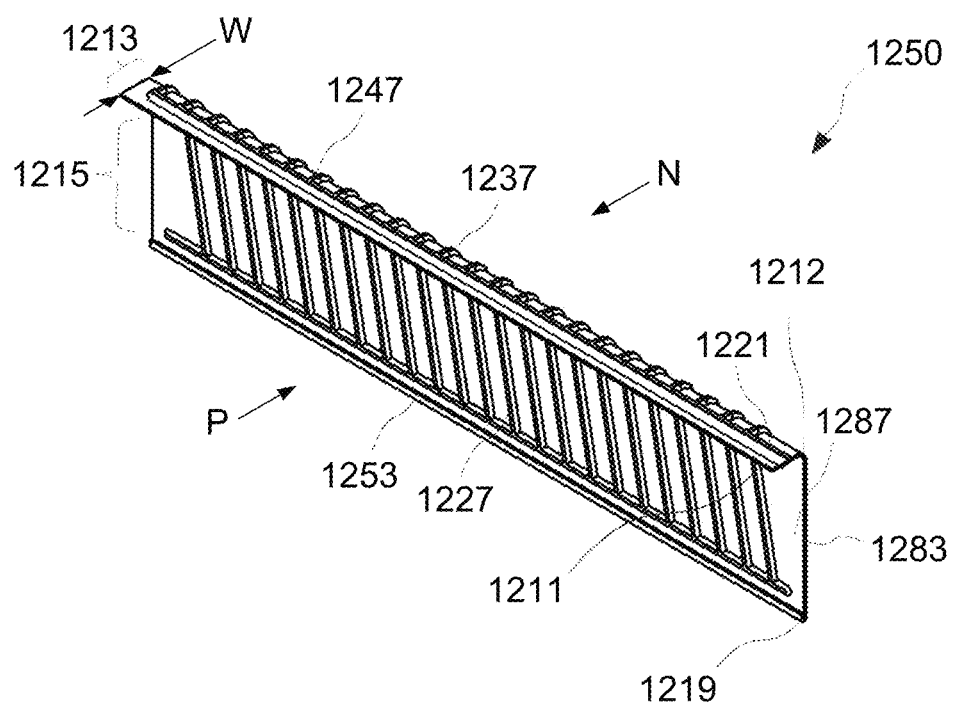
FIG. 13B is a schematic perspective view of the heat exchanger fin of FIG. 13A, according to embodiments of the disclosure.
Figure 13C:
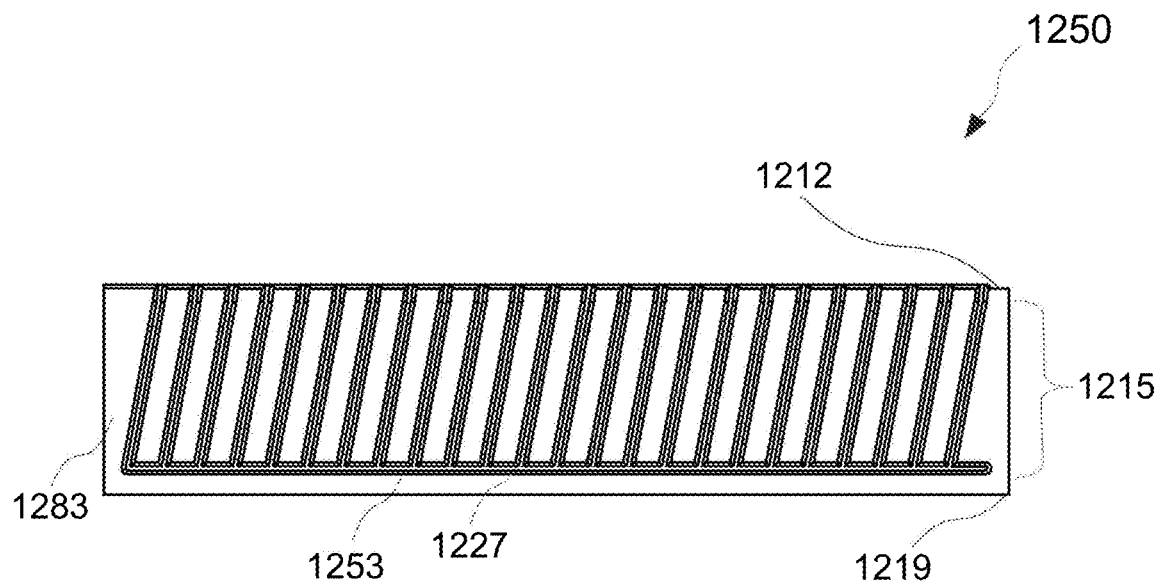
FIG. 13C is a side view of the heat exchanger fin of FIGS. 13A and 13B in the direction of arrow N, according to embodiments of the disclosure.
Figure 13D:
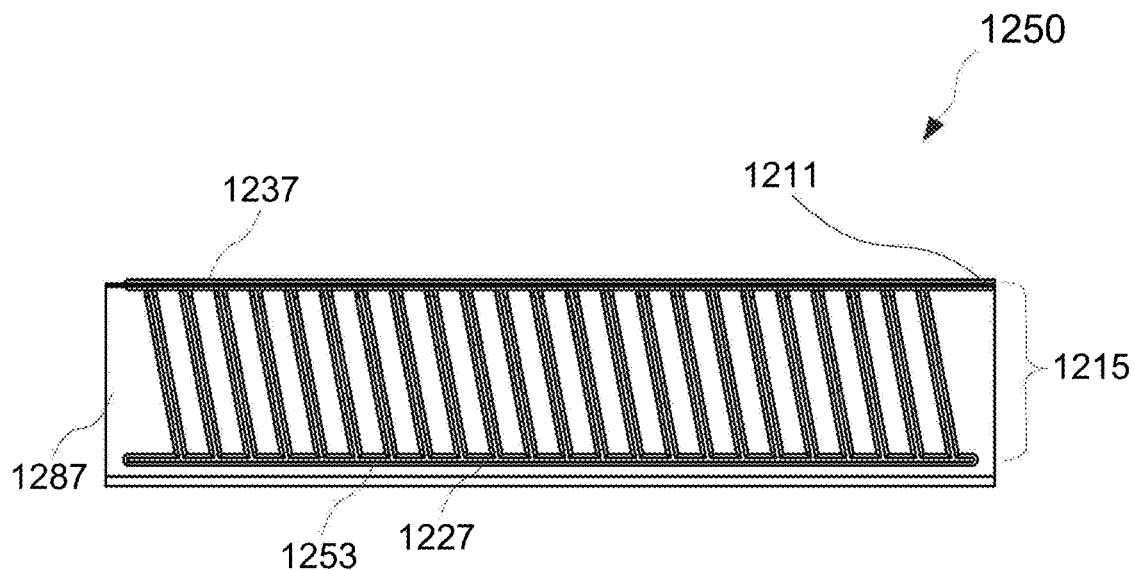
FIG. 13D is a side view of the heat exchanger fin of FIGS. 13A and 13B in the direction of arrow P, according to embodiments of the disclosure.
Figure 14A:
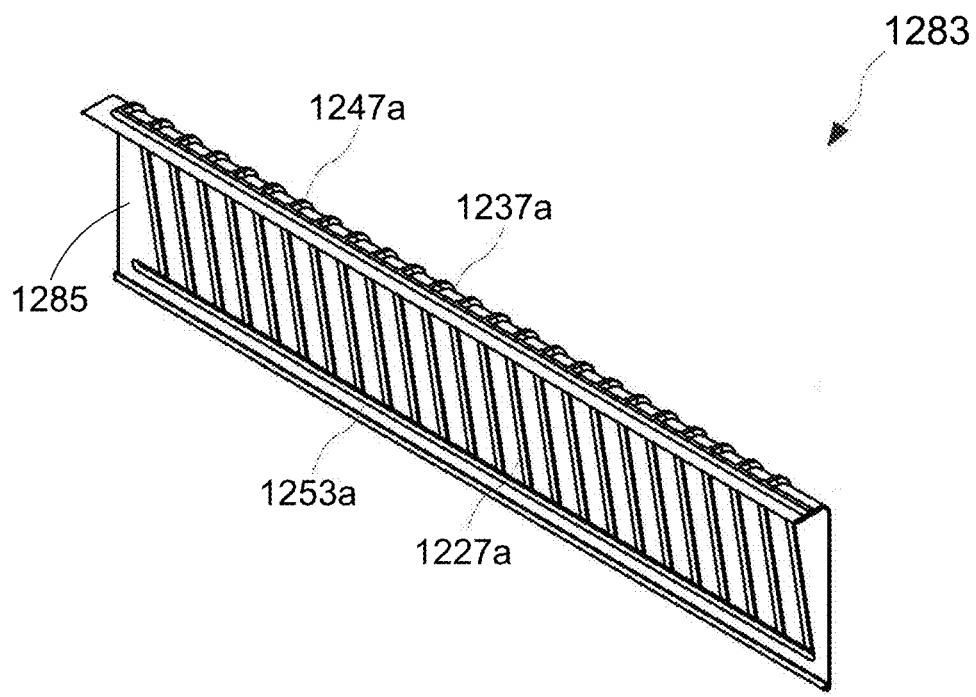
FIG. 14A is a schematic view of a first metal sheet of the heat exchanger fin of FIGS. 12A-13D, according to embodiments of the disclosure.
Figure 14B:
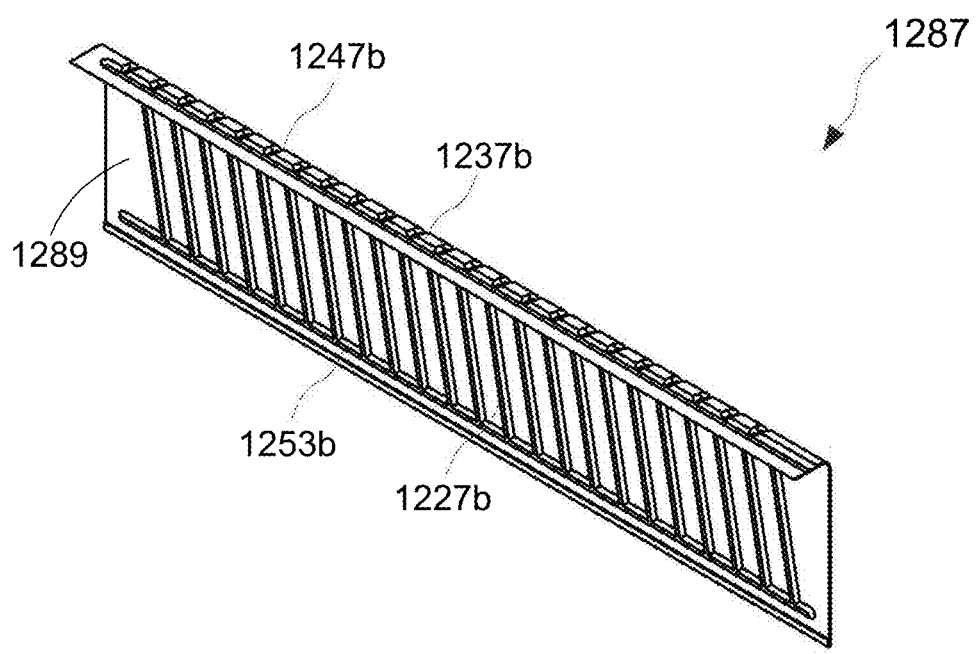
FIG. 14B is a view of a second metal sheet of the heat exchanger fin of FIGS. 12A-13D, according to embodiments of the disclosure.

FIG. 13A is a side view of a heat exchanger fin 1250 of the heat exchanger of FIG. 12A and FIG. 12B in the direction of arrow M in FIG. 12B, according to embodiments of the disclosure. FIG. 13B is a schematic perspective view of the heat exchanger fin 1250 of FIG. 13A, according to embodiments of the disclosure. FIG. 13C is a side view of the heat exchanger fin 1250 of FIGS. 13A and 13B in the direction of arrow N, according to embodiments of the disclosure. FIG. 13D is a side view of the heat exchanger fin 1250 of FIGS. 13A and 13B in the direction of arrow P, according to embodiments of the disclosure. FIG. 14A is a schematic view of a first metal sheet 1283 of the heat exchanger fin 1250 of FIGS. 12A-13D, according to embodiments of the disclosure. FIG. 14B is a view of a second metal sheet 1287 of the heat exchanger fin 1250 of FIGS. 12A-13D, according to embodiments of the disclosure.

Referring to FIGS. 13A to 14B, with continued reference to FIGS. 12A and 12B, each heat exchanger fin 1250 includes a body 1201 formed of a first metal sheet 1283 having a first inner surface and a second metal sheet 1287 having a second inner surface. The first and second metal sheets 1283 and 1287 are coupled to each other via a first inner surface 1285 of the first metal sheet 1283 and a second inner surface 1289 of the second metal sheet 1287. When coupled, the first and second inner surfaces 1285, 1289 face each other. The first and second metal sheets 1283 and 1287 together form the fin base 1219, the fin intermediate region 1212, the fin tip 1211, the auxiliary enhancement portion 1213, and the exchanger enhancement portion 1215. The auxiliary enhancement portion 1213 includes a condensation channel 1237 and multiple auxiliary channels 1247 (FIG. 13B), and the exchanger enhancement portion 1215 includes multiple connecting channels 1227 (FIG. 13B) and an evaporation channel 1253.

Referring to FIGS. 14A and 14B, the first metal sheet 1283 forms a generally upper portion of each fin 1250 and the second metal sheet 1287 forms a generally lower portion of the each fin 1250. The inner surfaces 1285 and 1289 of the first metal sheet 1283 and the second metal sheet 1287, respectively, contact each other at locations in the fin 1250 that do not include the condensation channel 1237, the auxiliary channels 1247, the connecting channels 1227, and the evaporation channel 1253. Each of the first metal sheet 1283 and the second metal sheet 1287 defines a portion of the condensation channel 1237, the auxiliary channels 1247, the connecting channels 1227, and the evaporation channel 1253. The first metal sheet 1283 includes first portion 1237*a* of the condensation channel 1237, first portions 1247*a* of each of the auxiliary channels 1247, first portions 1227*a* of each of the connecting channels 1227, and first portion 1253*a* of the evaporation channel 1253. Each of the first portions 1237*a*, 1247*a*, 1227*a*, and 1253*a* in the first metal sheet 1287 is formed as a recess on the first inner surface 1285 of the first metal sheet 1283.

Similarly, the second metal sheet 1287 includes second portion 1237*b* of the condensation channel 1237, second portions 1247*b* of each of the auxiliary channels 1247, second portions 1227*b* of each of the connecting channels 1227, and second portion 1253*b* of the evaporation channel 1253. Each of the second portions 1237*b*, 1247*b*, 1227*b*, and 1253*b* in the second metal sheet 1289 is formed as a recess in the second inner surface 1289 of the first metal sheet 1283. The first portions 1237a, 1247a, 1227a, and 1253a and the second portions 1237b, 1247b, 1227b, and 1253b together define the corresponding condensation channel 1237, auxiliary channels 1247, connecting channels 1227, and evaporation channel 1253.

In some embodiments, the condensation channel 137 extends longitudinally along the auxiliary enhancement region 1213 and at or adjacent the fin tip 1211. Each of the multiple auxiliary channels 147 are in fluid communication with the condensation channel 1237. The exchanger enhancement portion 1215 includes the evaporation channel 1253 extending longitudinally at or adjacent along the fin base 1219, and multiple connecting channels 127 in fluid communication with the evaporation channel 1253. The number of auxiliary channels 147 corresponds to the number of connecting channels 127 and each auxiliary channel 127 is in fluid communication with a corresponding connecting channel 127. As such, the condensation channel 137, the multiple auxiliary channels 147, the multiple connecting channels 127, and the evaporation channel 153 are all in fluid communication with each other. The auxiliary channels 147 and the connecting channels 127 are disposed in parallel at regular intervals and at an incline (angle greater than 0° or less than 90°) with respect to the evaporation channel 153 and the condensation channel 137. The evaporation channel 153 and the condensation channel 137 are disposed substantially parallel (+/−1-2°) to each other. The angle of the auxiliary channels 147 and the connecting channels 127 is not limited to any particular angle. The auxiliary channels 147 and the connecting channels 127 can be orientated at any desired angle as long as working fluid in the auxiliary channels 147 and the connecting channels 127 flows in a downward direction during operation when the heat exchanger 1200 is installed in an upright position.

Although only a single condensation channel 137 and a single evaporation channel 153 are discussed herein, embodiments are not limited in this regard and the heat exchanger 1200 can include more than one condensation channel 137 and more than one evaporation channel 153, without departing from the scope of the disclosure. When more than one condensation channel 137 and evaporation channel 153 are installed, the connecting channels 127 are in fluid contact with each evaporation channel 153 and the auxiliary channels are in fluid contact with each condensation channel 137.

In some embodiments, a volume of the working fluid that flows through unit volumes of the condensation channel 1237 and the evaporation channel 1253 is generally uniform across the entirety of each channel and is around two times the flow volume the channels 147 and the connecting channels 127. However, embodiments are not limited thereto and the cross-sectional area and/or length of the condensation channel 1237 and the evaporation channel 1253 can be varied as required by application and design, and without departing from the scope of the disclosure.

In some embodiments, each heat exchanger fin 1250 is under vacuum and includes a working fluid therein. The working fluid is in the form of liquid vapor slugs/bubbles throughout the auxiliary channel 1247 of the auxiliary enhancement region 1213 and the connecting channel 1227 and the evaporation channel 1253 of the exchanger enhancement portion 1215. Each heat exchanger fin 1250 includes an evaporator region (including the evaporation channel 1253), a condenser region (including the condensation channel 1237), vapor flow region (including the auxiliary channels 147 and the connecting channels 127) extending from the evaporator region and condenser region, respectively.

When heat from the first heat source 1282 and the second heat source 1288 is applied to the contact surface 1299 of the base plate 1290, the heat converts the working fluid to vapor and the vapor bubbles increase in size and number within the vapor flow region. Meanwhile, at the condenser region, heat is removed (dissipated) and the bubbles are reduced. The volume expansion of the working fluid due to vaporization and the contraction due to condensation causes an oscillating motion within the condensation channel 1237, the auxiliary channels 1247, the connecting channels 1227, and the evaporation channel 1253. The volume of the condenser region is at least equal to or greater than the volume of the evaporator region, thereby facilitating the oscillating motion. The net effect of the temperature gradient between the evaporator region and condenser region and the pressure differences introduced throughout the condensation channel 1237, the auxiliary channels 1247, the connecting channels 1227, and the evaporation channel 1253 creates a non-equilibrium pressure condition. As a result of the increased output pressure gain in downward working fluid flow through the auxiliary channels 1247, a portion of the connecting channels 1227 boosts upward oscillation driving forces throughout the evaporation channel 1253 and other portion of the connecting channels 1227, and increased surface area of the auxiliary enhancement portion 1213, improving the heat transfer efficiency rate for the heat sources (electric devices). Thermo-fluidic transport is thus provided within each heat exchanger fin 1250 via the self-sustaining oscillation driving forces, whereby the pressure pulsations are thermally driven.

Those of ordinary skill in the relevant art will appreciate that the shape, width and lengths of the condensation channel 1237 and the auxiliary channels 1247 of the auxiliary enhancement portion 1213 and the connecting channels 1227 and the evaporation channels 1253 of the exchanger enhancement portion 1215 may be varied, such as having a wavy shape, having increased or decreased widths, having longer or shorter lengths, or any combination thereof, depending upon application and design requirements, without departing from the scope of the disclosure.

The plurality of heat exchanger fins 1250 under vacuum and including a working fluid in the condensation channel 1237, the auxiliary channels 1247, the connecting channels 1227, and the evaporation channel 1253 increases the heat dissipation and thermal performance of each heat exchanger fin 1250 when compared existing heat exchanger fins that do not include the channel structure including a working fluid. Also, the auxiliary enhancement portion 1213 increases the surface area of the heat source(s) (e.g., electronic devices) in thermal contact with the heat exchanger while keeping the space occupied by the heat exchanger minimal. Thus, the rate of convective heat transfer is further improved while preventing formation of a layer of heated air on the surface of base plate 1290 that impedes heat transfer.

Figure 15:
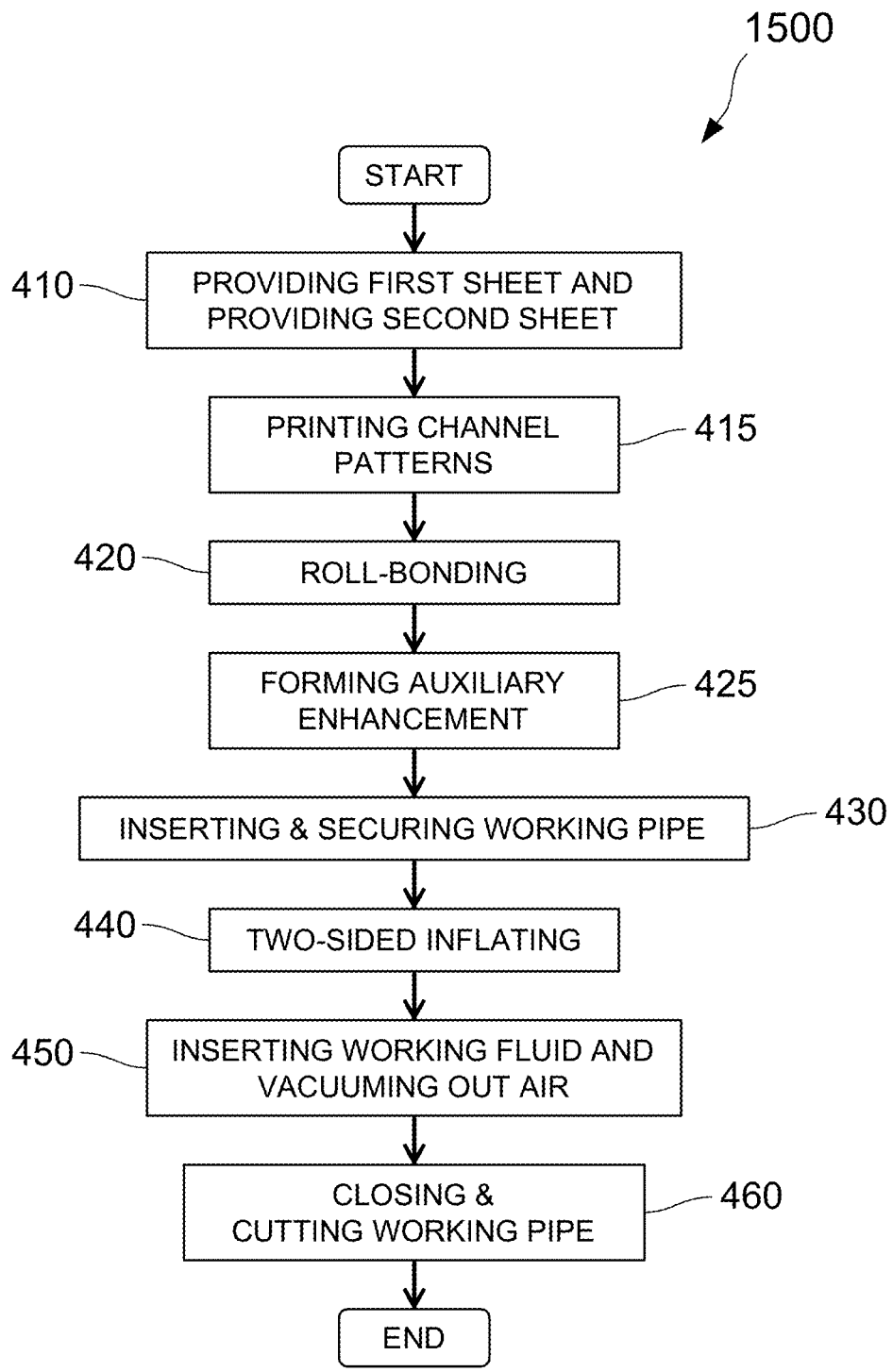
FIG. 15 is a flow chart illustrating a manufacturing method of the heat exchanger fin of FIGS. 12A and 12B, according to embodiments of the disclosure.

In some embodiments, each heat exchanger fin 1250 is made of aluminum, or an aluminum-alloy or the like, and formed by roll-bonding. FIG. 15 is a flow chart illustrating a manufacturing method 1500 of the heat exchanger fin 1250 of FIGS. 12A and 12B, according to embodiments of the disclosure. Referring to FIG. 15, with continued reference to FIGS. 12A to 14B, the method 1500 of manufacturing the heat exchanger fin 1250 under vacuum and including a working fluid therein, generally includes operation 410 for providing a first metal sheet 1283 and a second metal sheet 1287. In some embodiments, the first and second metal sheets 1283, 1287 are metal coils, unrolled using an unwinder and then aligned by a suitable roller stand. Next, in operation 415, a pattern of the condensation channel 1237, the auxiliary channels 1247, the connecting channels 1227, and the evaporation channel 1253 are printed on the first metal sheet 1283 (or the second sheet 1287). In some embodiments, the sheets are cleaned and then printed using a screen printing process that uses a graphite pattern of the condensation channel 1237, the auxiliary channels 1247, the connecting channels 1227, and the evaporation channel 1253.

In some embodiments, each heat exchanger fin 1250 further includes a working channel 1221 (FIGS. 13B and 16A) extending from one end of the working section 521 of each heat exchanger fin 1250. In some embodiments, the screen printing process employing the graphite pattern also prints the working channel. Following, in operation 420, the first inner surface 1285 of the first metal sheet 1283 and the second inner surface 1289 of the second metal sheet 1287 are integrally bonded in areas other than the channel printed areas. Thereafter, in operation 425, the auxiliary enhancement portion 1213 is formed by bending the coupled first and second metal sheets 1283 and 1287. In some embodiments, the width W (FIG. 13B) of the auxiliary enhancement portion 1213 is substantially equal to the separation between adjacent heat exchanger fins 1250. However, the embodiments are not limited thereto. The width may be shorter than the distance between adjacent heat exchanger fins 1250.

Those of ordinary skill in the relevant art will appreciate that the use of graphite serves as a release agent, thus, preventing the first and second metal sheets from integrally bonding in at least the areas of the applied patterned. In other embodiments, other release agents may be used to prevent the first and second metal sheets from integrally bonding in the areas of the applied pattern.

In some embodiments, the thickness of the first and second metal sheets is around 0.250 mm to around 3.00 mm, and the roll-bonding process reduces the thickness of the first and second metal sheets by around 40% to around 60%. However, in other embodiments, the thicknesses and reduction of the first and second metal sheets can be more or less, depending upon the material, original thickness, number of sheets, processes employed, and design requirements to obtain desired thermal performance.

In some embodiments, the shape of each heat exchanger fin 1250 is quadrilateral shaped. However, embodiments are not limited thereto and the heat exchanger fin may be of a shape other than quadrilateral shaped, and may be made up of more than one shape according to application and design requirements, and without departing from the scope of the disclosure.

Figure 16A:
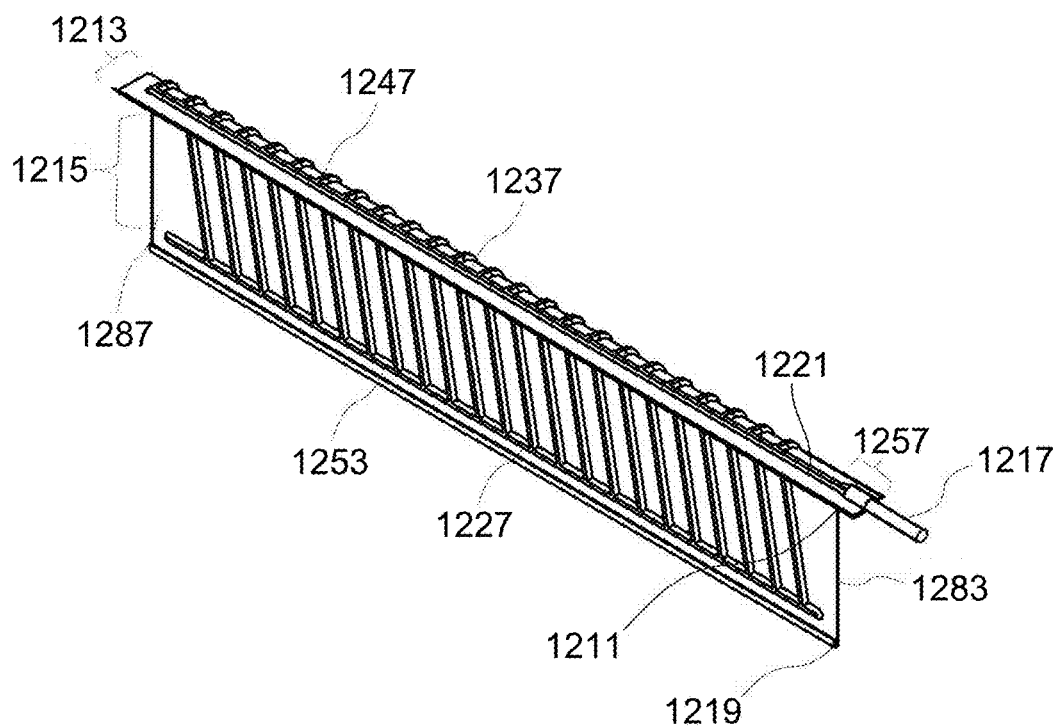
FIG. 16A is a schematic perspective view of the heat exchanger fin of FIG. 12A and FIG. 12B following an operation of the manufacturing method of FIG. 15, according to embodiments of the disclosure.

FIG. 16A is schematic perspective view of the heat exchanger fin of FIG. 12A and FIG. 12B following operation 440 of the manufacturing method 1500 of FIG. 15, according to embodiments of the disclosure. Referring to FIG. 16A, in operation 430 a working pipe 1217 is inserted and secured to a working channel 1221, extending from the one end of a working section 1257 of each heat exchanger fin 1250. The working pipe 1217 allows for fluid communication with the condensation channel 1237, the auxiliary channels 1247, the connecting channels 1227, and the evaporation channel 1253. Following, in operation 440, the condensation channel 1237, the auxiliary channels 1247, the connecting channels 1227, and the evaporation channel 1253 are inflated via a fluid (vapor or gas) having a pressure configured for even inflation throughout the heat exchanger fin 1250. In some embodiments, the gas is atmospheric air having a suitable pressure for inflation. However, embodiments are not limited thereto, and in other embodiments, the gas or vapor may be nitrogen, oxygen, argon, hydrogen, carbon dioxide, or any of the commonly available commercial gasses or compatible mixtures thereof. In some embodiments, the first and second metal sheets 1283, 1287 are inserted into a mold before inflating for even inflation throughout each heat exchanger fin 1250.

In some embodiments, the cross-sectional width (or radius) of the condensation channel 1237 and the evaporation channel 1253 is around 0.125 mm to around 1.50 mm and of the auxiliary channels 1247 and the connecting channels 1227 is around 0.0625 mm to around 0.75 mm. However, embodiments are not limited thereto and the widths can be increased or decreased as required by application and design, without departing from the scope of the disclosure.

Figure 16B:
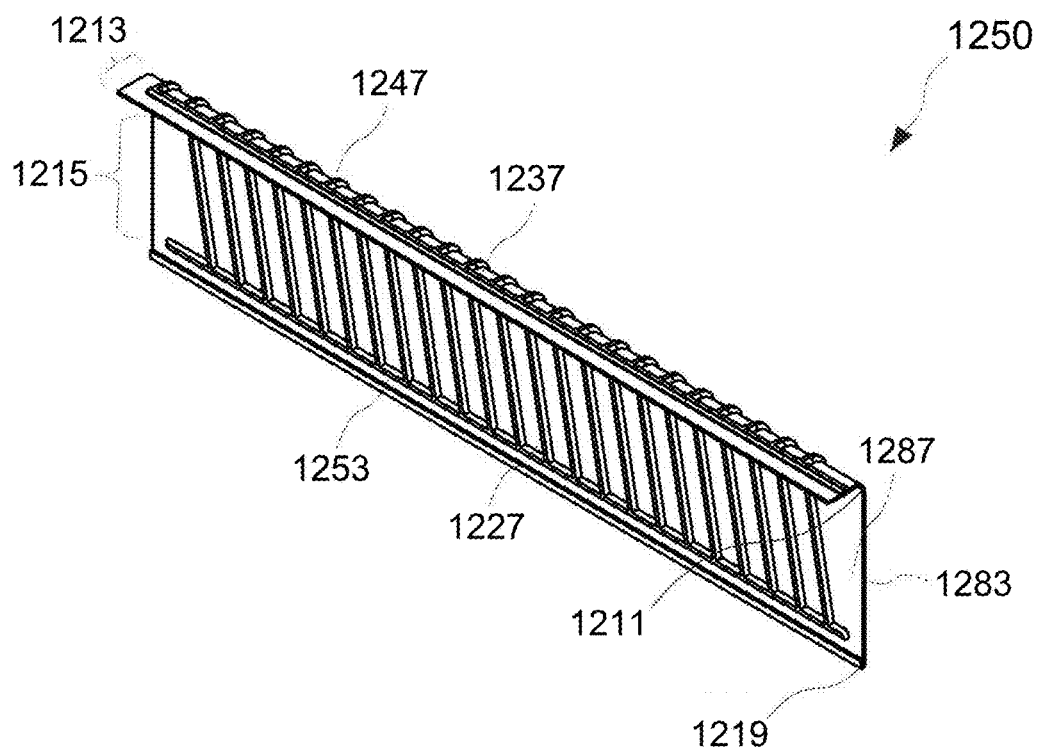
FIG. 16B is schematic perspective view of the heat exchanger fin of FIG. 16A following an operation of the manufacturing method of FIG. 15, according to embodiments of the disclosure.

In operation 450, a working fluid is introduced into the inflated channels via the working pipe 1217 and then air is vacuumed out. FIG. 16B is schematic perspective view of the heat exchanger fin 1250 of FIG. 16A following operation 460 of the manufacturing method 1200 of FIG. 15, according to embodiments of the disclosure. Referring to FIG. 16B, in operation 460, the working pipe 1217 is closed and sealed by flattening and then sealing the first and second metal sheets 1285 and 1287, and after cooling, the working channel of the working section 1257 is trimmed, thereby resulting in the heat exchanger fin 1250 including the condensation channel 1237, the auxiliary channels 1247, the connecting channels 1227, and the evaporation channel 1253.

Figure 17:
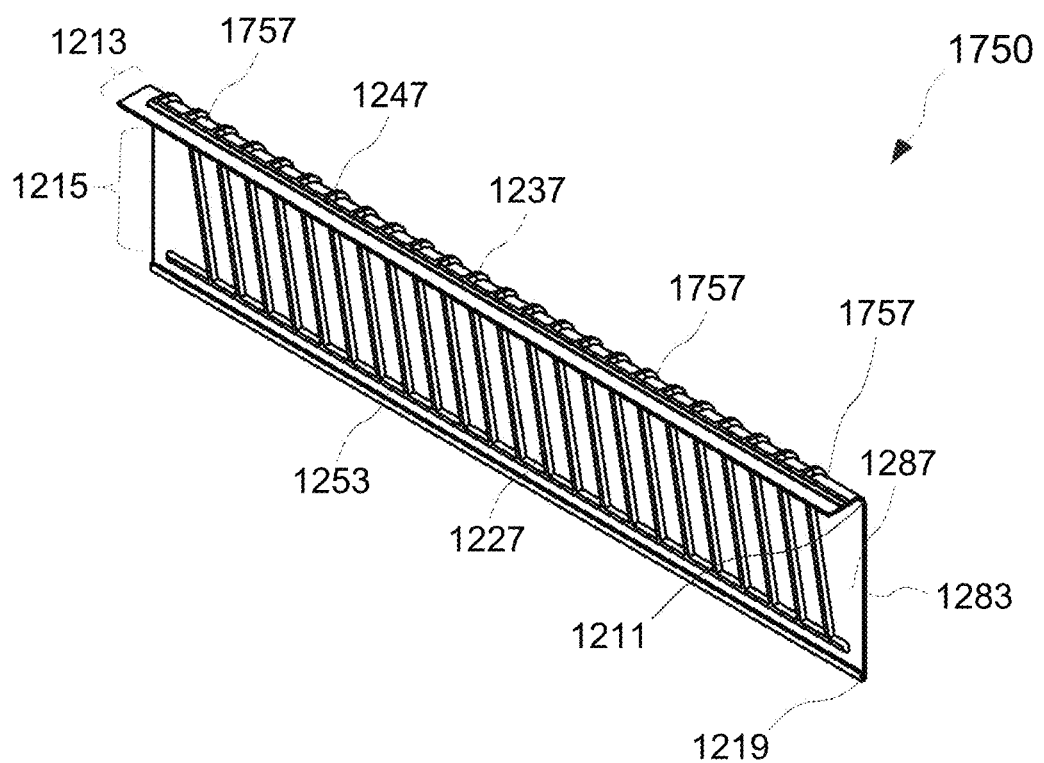
FIG. 17 is schematic perspective first view of a heat exchanger, according to embodiments of the disclosure

FIG. 17 is a perspective view of a heat exchanger fin 1750, according to embodiments of the disclosure. The heat exchanger fin 1750 can be employed in the heat exchanger 1200 of FIGS. 12A to 12B. The heat exchanger fin 1750 may be similar in some respects to the heat exchanger fin 1250 in FIGS. 12A to 16B, and therefore may be best understood with reference thereto where like numerals designate like components not described again in detail. Referring to FIG. 17, the auxiliary enhancement portion 1213 further includes one or more auxiliary through holes 1757. The auxiliary through holes 1757 are located in the auxiliary enhancement portion 1213 and separated by the auxiliary channels 1247, and are separate (discrete) from the condensation channel 1237 and the auxiliary channels 1247. However, in other embodiments, two or more auxiliary through holes 1757 can be placed directly adjacent each other and not separated by auxiliary channel(s) 1247.

The auxiliary through holes 1757 permit air to pass through portions of the auxiliary enhancement portion 1213, thereby further improving heat dissipation and thermal performance of each heat exchanger fin 1750 by allowing higher temperature air to more conveniently rise.

In some embodiments, a single auxiliary through hole 1757 can be included. The number of auxiliary through holes 1757 can be varied as required by design and application, without departing from the scope of the disclosure. In some embodiments, the auxiliary through hole 1757 is circular-shaped. However, in other embodiments the auxiliary through hole 1757 is quadrilateral-shaped, hexagonal-shaped, or any other suitable shape that permits air to pass therethrough.

In some embodiments, the heat exchanger fin 1750 can be manufactured using the method 1500 discussed above, and the through-holes 1757 are drilled between operation 440 and operation 450. The remaining operations are similar and a discussion thereof is omitted for the sake of brevity.

In some embodiments, the first metal sheet 1283 and the second metal sheet 1287 are made of aluminum, or an aluminum-alloy or the like, and formed by roll-bonding. In other embodiments, the first metal sheet 1283 and the second metal sheet 1287 are formed by stamping or other desired processes depending upon material and manufacturing requirements. In other embodiments, the first metal sheet 1283 and the second metal sheet 1287 include copper, or a copper-alloy or the like, or other malleable metal heat conducting material having a relatively high thermal conductivity, depending upon application and design requirements.

In some embodiments, the base plate 1290 includes aluminum, or an aluminum-alloy or the like and that can be utilized for brazing techniques for thermal and mechanical brazing each fin base 1219 of the heat exchanger fin 1250 to the corresponding mounting grooves 1292. In other embodiments, the base plate 1290 includes copper, or a copper-alloy or the like, or other malleable metal heat conducting material having a relatively high thermal conductivity, depending upon application and design requirements.

In some embodiments, the base plate 1290 includes a solid malleable metal heat conducting material having a relatively high thermal conductivity. In other embodiments, the base plate 1290 is under vacuum and has a working fluid therein. In yet other embodiments, the base plate 1290 has an inlet and an outlet for introducing and removing working fluid.

In some embodiments, if a stamping process or the like is used to form each heat exchanger fin 1250, bonding methods, such as ultrasonic welding, diffusion welding, laser welding and the like, can be used to bond and integrally form the first and second inner surfaces together at areas other than the channel areas.

In some embodiments, if a stamping process or the like is used, depending upon dimensions and application, axial or circumferential wick structures, having triangular, rectangular, trapezoidal, reentrant, etc. cross-sectional geometries, may be formed on inner surfaces of the condensation channel 1237, the auxiliary channel 147, the connecting channel 1227, and the evaporation channel 1253. The wick structure is used to facilitate the flow of condensed fluid by capillary force back to the evaporation surface, keeping the evaporation surface wet for large heat fluxes.

Those of ordinary skill in the relevant art may readily appreciate that in alternative embodiments, further heat treatment processes can be employed throughout the manufacturing method of each heat exchanger fin 1250, and the embodiments are not limited to those described. Additionally, those skilled in the relevant art may readily appreciate that additional operations can be added to the process in order to incorporate additional features into the finished product. Also, the operations can be altered depending upon different requirements. As an example, the method 1500 can include operations of alloying, casting, scalping and preheating, intermediate operations such as intermediate annealing, and finishing operations such as solution heat treatment or final annealing, stretching, leveling, slitting, edge trimming and aging, and the like may be employed.

In further alternative embodiments, the heat exchanger fin 1250 and/or 1750 can be employed as a stand-alone heat exchanger, without departing from the scope of the disclosure. In some embodiments, the working fluid includes acetone. However, the embodiments are not limited thereto. In other embodiments, the working fluid includes cyclopentane or n-hexane.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heat dissipation device, comprising:
    a plurality of parallel fins, wherein each of the fins comprises:
        a fin body including a first metal sheet and a second metal sheet coupled to each other;
        a plurality of through holes formed through the fin body;
        a plurality of channels defined between the first and second metal sheets; and
        a working fluid in the plurality of channels,
            wherein the first and second metal sheets are recessed toward and bonded to each other surrounding each of the through holes individually; and
            wherein each through hole of the plurality of through holes is surrounded by the plurality of channels such that the through holes are separated from one another by the channels.

2. The heat dissipation device of claim 1, wherein the first metal sheet and the second metal sheet are spaced apart from each other to define the plurality of channels.

3. The heat dissipation device of claim 1, wherein the plurality of through holes are configured to cause air flowing therethrough to flow transverse to air flowing along surfaces of the first and second metal sheets.

4. The heat dissipation device of claim 1, wherein the plurality of through holes have a staggered pitch.

5. The heat dissipation device of claim 1, wherein a thickness of the first and second metal sheets is around 0.250 mm to around 3.00 mm.

6. The heat dissipation device of claim 1, wherein the plurality of through holes have a same diameter.

7. The heat dissipation device of claim 1, wherein the plurality of through holes have different diameters.

8. The heat dissipation device of claim 1, wherein the heat dissipation device is hemmed along an edge thereof.

9. A heat dissipation device, comprising:
    a base plate; and
    a plurality of fins arranged on the base plate, wherein each of the fins comprises:
        a fin body including a first metal sheet and a second metal sheet coupled to each other;
        a plurality of through holes formed through the fin body;
        a plurality of channels defined between the first metal sheet and the second metal sheet; and
        a working fluid in the plurality of channels,
            wherein the first and second metal sheets are recessed toward and bonded to each other surrounding each of the through holes individually; and
            wherein each through hole of the plurality of through holes is surrounded by the plurality of channels such that the through holes are separated from one another by the channels.

10. The heat dissipation device of claim 9, wherein the fins are arranged on the base plate in a longitudinally extending direction in which a longitudinal edge of each fin contacts the base plate.

11. The heat dissipation device of claim 9, wherein the base plate includes a plurality of grooves and each groove includes a corresponding fin of the plurality of fins.

12. The heat dissipation device of claim 9, wherein the first metal sheet and the second metal sheet are spaced apart from each other to define the plurality of channels.

* * * * *